United States Patent
Choung et al.

(10) Patent No.: US 10,340,473 B2
(45) Date of Patent: Jul. 2, 2019

(54) ORGANIC LIGHT EMITTING DISPLAY DEVICE WITH OPTICAL RESONANCE STRUCTURE AND METHOD OF MANUFACTURING THE SAME

(71) Applicant: SAMSUNG DISPLAY CO., LTD., Yongin-si, Gyeonggi-Do (KR)

(72) Inventors: Jiyoung Choung, Yongin-si (KR); Jungsun Park, Yongin-si (KR); Hyunsung Bang, Yongin-si (KR); Duckjung Lee, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 180 days.

(21) Appl. No.: 14/844,321

(22) Filed: Sep. 3, 2015

(65) Prior Publication Data
US 2016/0248039 A1    Aug. 25, 2016

(30) Foreign Application Priority Data
Feb. 24, 2015  (KR) .......................... 10-2015-0025912

(51) Int. Cl.
| | |
|---|---|
| *H01L 27/32* | (2006.01) |
| *H01L 51/52* | (2006.01) |
| *H01L 29/08* | (2006.01) |
| *H01L 35/24* | (2006.01) |
| *H01L 51/00* | (2006.01) |

(52) U.S. Cl.
CPC ...... *H01L 51/5228* (2013.01); *H01L 51/5234* (2013.01); *H01L 27/3211* (2013.01); *H01L 51/5265* (2013.01)

(58) Field of Classification Search
CPC .................................................. H01L 51/5228
See application file for complete search history.

(56) References Cited

U.S. PATENT DOCUMENTS

| | | | |
|---|---|---|---|
| 8,809,111 B2 | 8/2014 | Ober et al. | |
| 8,846,301 B2 | 9/2014 | Ober et al. | |
| 2005/0029936 A1* | 2/2005 | Kim .................... | H01L 27/3244 313/506 |
| 2006/0102912 A1* | 5/2006 | Abe ..................... | H01L 27/3211 257/88 |
| 2006/0188697 A1 | 8/2006 | Lee | |
| 2007/0188084 A1* | 8/2007 | Fukuoka ............. | H01L 51/5265 313/506 |
| 2007/0228937 A1* | 10/2007 | Akiyoshi ............ | H01L 27/3246 313/503 |

(Continued)

FOREIGN PATENT DOCUMENTS

| | | |
|---|---|---|
| JP | 2006-216563 A | 8/2006 |
| JP | 2011-204646 A | 10/2011 |

(Continued)

*Primary Examiner* — Nduka E Ojeh
(74) *Attorney, Agent, or Firm* — Lee & Morse, P.C.

(57) ABSTRACT

An organic light emitting display device has a plurality of first electrodes, intermediate layers, and second electrodes that correspond to a plurality of pixel areas. The first electrodes are spaced from one another, the second electrodes are spaced from one another, and the intermediate layers are spaced from one another. A conductive protection layer is formed over the second electrodes, and a connection electrode layer is formed over the conductive protection layer and electrically connecting the second electrodes.

31 Claims, 23 Drawing Sheets

(56) References Cited

U.S. PATENT DOCUMENTS

| | | | |
|---|---|---|---|
| 2009/0184636 A1* | 7/2009 | Cok | H01L 51/5234 |
| | | | 313/505 |
| 2009/0212687 A1* | 8/2009 | Cok | H01L 51/5265 |
| | | | 313/504 |
| 2009/0278450 A1* | 11/2009 | Sonoyama | H01L 27/322 |
| | | | 313/504 |
| 2010/0171419 A1 | 7/2010 | Kim et al. | |
| 2012/0104422 A1 | 5/2012 | Lee et al. | |
| 2013/0147689 A1* | 6/2013 | Liu | G09G 3/30 |
| | | | 345/76 |
| 2013/0236999 A1 | 9/2013 | Lee et al. | |
| 2014/0070187 A1* | 3/2014 | Cho | H01L 51/52 |
| | | | 257/40 |
| 2014/0127625 A1 | 5/2014 | Defranco et al. | |
| 2014/0175390 A1 | 6/2014 | Kim et al. | |

FOREIGN PATENT DOCUMENTS

| | | |
|---|---|---|
| KR | 10-2002-0059535 A | 7/2002 |
| KR | 10-2010-0081771 A | 7/2010 |
| KR | 10-2012-0044876 A | 5/2012 |

\* cited by examiner

ORGANIC LIGHT EMITTING DISPLAY DEVICE WITH OPTICAL RESONANCE STRUCTURE AND METHOD OF MANUFACTURING THE SAME

CROSS-REFERENCE TO RELATED APPLICATION

Korean Patent Application No. 10-2015-0025912, filed on Feb. 24, 2015, and entitled "Organic Light Emitting Display Device and Method Of Manufacturing The Same," is incorporated by reference herein in its entirety.

BACKGROUND

1. Field

One or more embodiments described herein relate to an organic light emitting display device and a method of manufacturing an organic light emitting display device.

2. Description of the Related Art

An organic light emitting display device is lightweight and thin and has a wide viewing angle, fast response speed, and reduced power consumption compared to other types of display devices. In order to realize a full color display, different color pixels may have light resonance structures with different optical lengths.

SUMMARY

In accordance with one or more embodiments, an organic light emitting display device includes a substrate including a plurality of pixel areas; a plurality of first electrodes corresponding to the pixel areas and separated from each other; a plurality of intermediate layers corresponding to the pixel areas and separated from each other; a plurality of second electrodes corresponding to the pixel areas and separated from each other; a conductive protection layer over the second electrodes; and a connection electrode layer over the conductive protection layer and electrically connecting the second electrodes.

The connection electrode layer may be integrally formed to cover the pixel areas. The second electrodes and the connection electrode layer may include a transflective metal layer. A thickness of the conductive protection layer may be greater than a thickness of each of the second electrodes and a thickness of the connection electrode layer. The conductive protection layer may be a translucent layer.

The intermediate layers and the second electrode layers may correspond to the pixel areas have substantially a same pattern. A distance between the second electrode and the connection electrode layer corresponding to at least one of the pixel areas may correspond to an optical resonance distance of light emitted from the at least one of the pixel areas. At least one of a distance between the first electrode and the second electrode corresponding to at least one of the pixel areas or a distance between the first electrode and the connection electrode layer corresponding to at least one of the pixel areas may correspond to an optical resonance distance of light emitted from the at least one of the pixel areas.

The pixel areas may include a first pixel area corresponding to first color emission of light and a second pixel area corresponding to a second color emission of light, and a thickness of the second electrode corresponding to the first pixel area may be different from a thickness of the second electrode corresponding to the second pixel area. The conductive protection layer may be integrally formed with respect to the second electrodes. The display device may include a pixel defining layer between adjacent ones of the pixel areas, wherein at least part of a top surface of the pixel defining layer may be in direct contact with the conductive protection layer. The conductive protection layer may have a thickness based on an optical resonance distance of light emitted from one of the pixel areas.

The conductive protection layer may have island-type patterns corresponding to the pixel areas of the substrate. Each of the island-type patterns may substantially correspond to the island-type pattern of the second electrodes. The display device may include a pixel defining layer between adjacent ones of the pixel areas, wherein at least part of a top surface of the pixel defining layer may be in direct contact with the connection electrode layer.

The pixel areas may include a first pixel area corresponding to a first color emission of light and a second pixel area corresponding to a second color emission of light, and a thickness of the conductive protection layer corresponding to the first pixel area may be different from a thickness of the conductive protection layer corresponding to the second pixel area. The first electrodes may be anodes and the second electrodes may be cathodes. The display device may include a protection layer on the connection electrode layer. Each of the intermediate layers may include a first intermediate layer adjacent to the first electrode and an emission layer on the first intermediate layer. The first intermediate layer may include a hole transport layer.

In accordance with one or more other embodiments, a method is provided for manufacturing an organic light emitting display device, the method including preparing a substrate including a plurality of pixel areas; patterning first electrodes which are separated from each other and which correspond to the pixel areas of the substrate; forming intermediate layers and second electrodes, each of the intermediate layers and the second electrodes having island-type pattern to be separated from each other in correspondence to the plurality of pixel areas of the substrate; forming a conductive protection layer covering the second electrodes; and forming a connection electrode layer on the conductive protection layer, integrally formed with the pixel areas, and electrically connecting the second electrodes.

The second electrodes and the connection electrode layer may include a transflective metal layer. A thickness of the conductive protection layer may be greater than a thickness of each of the second electrodes and a thickness of the connection electrode layer. The conductive protection layer may be a translucent layer.

Forming the intermediate layers and the second electrodes may include forming a masking pattern, on the substrate, with an opening exposing a first electrode corresponding to a first pixel area, the first pixel area corresponding to a first color emission of light; forming an intermediate layer on an surface of the substrate including the masking pattern; forming the second electrodes on the intermediate layer; and removing the masking pattern such that the intermediate layers and the second electrodes in the island-type pattern remain in correspondence to the first pixel area.

The conductive protection layer may be formed so that part of the conductive protection layer corresponding to a first pixel area for performing a first color emission of light has a thickness based on an optical resonance distance of the light emitted from the first pixel area. The conductive protection layer may be integrally formed with respect to the second electrodes. The conductive protection layer may have an island-type pattern substantially corresponding to the island-type pattern of each of the second electrodes.

The first electrodes may be anodes and the second electrodes may be cathodes. Each of the intermediate layers may include a first intermediate layer adjacent to the first electrode and an emission layer on the first intermediate layer. The first intermediate layer may include a hole transport layer. The method may include forming a protection layer on the connection electrode layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
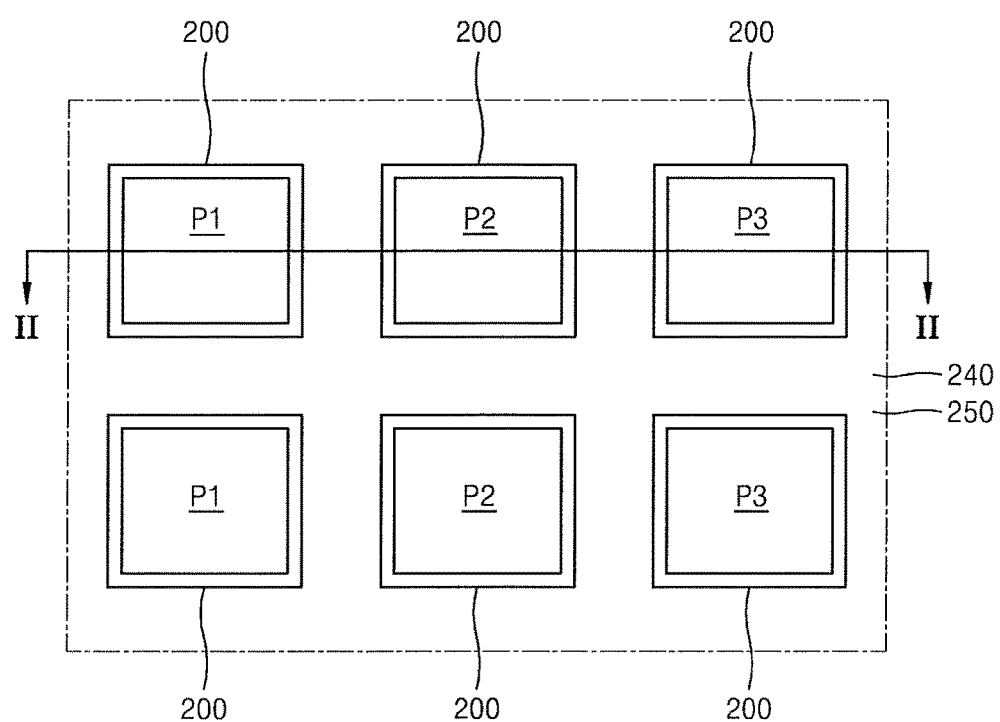
FIG. 1 illustrates an embodiment of an organic light emitting display device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates an embodiment of an organic light emitting display device which includes a plurality of pixel areas P1, P2, and P3. The pixel areas P1, P2, and P3 may be arranged to form a matrix and emit light of different colors. For example, the pixel areas P1, P2, and P3 may emit blue, green, and red light, respectively. For convenience of description, an example in which the first pixel area P1 emits blue light, the second pixel area P2 emits green light, and the third pixel area P3 emits red light will be described below. (In another embodiment, as long as a full color display is realized, the display device may emit a different combination of colors. Also, another embodiment may have a different number of pixel areas, e.g., may include a combination of four pixels that emit blue, green, red, and white light.)

A patterned stack structure 200 is in each of the pixel areas P1, P2, and P3. The stack structure 200 may include a first electrode 210, an intermediate layer 220, and a second electrode 230, see, e.g., FIG. 2. The second electrodes 230 of the stack structures 200 are electrically connected via a connection electrode layer 250, and a conductive protection layer 240 having a predetermined thickness is between the stack structure 200 and the connection electrode layer 250.

The pixel areas P1, P2, and P3 are arranged to form the matrix as illustrated, for example, in FIG. 1. According to another exemplary embodiment, the pixel areas P1, P2, and P3 may be arranged to have various other shapes, e.g., a pentile shape.

Figure 2:
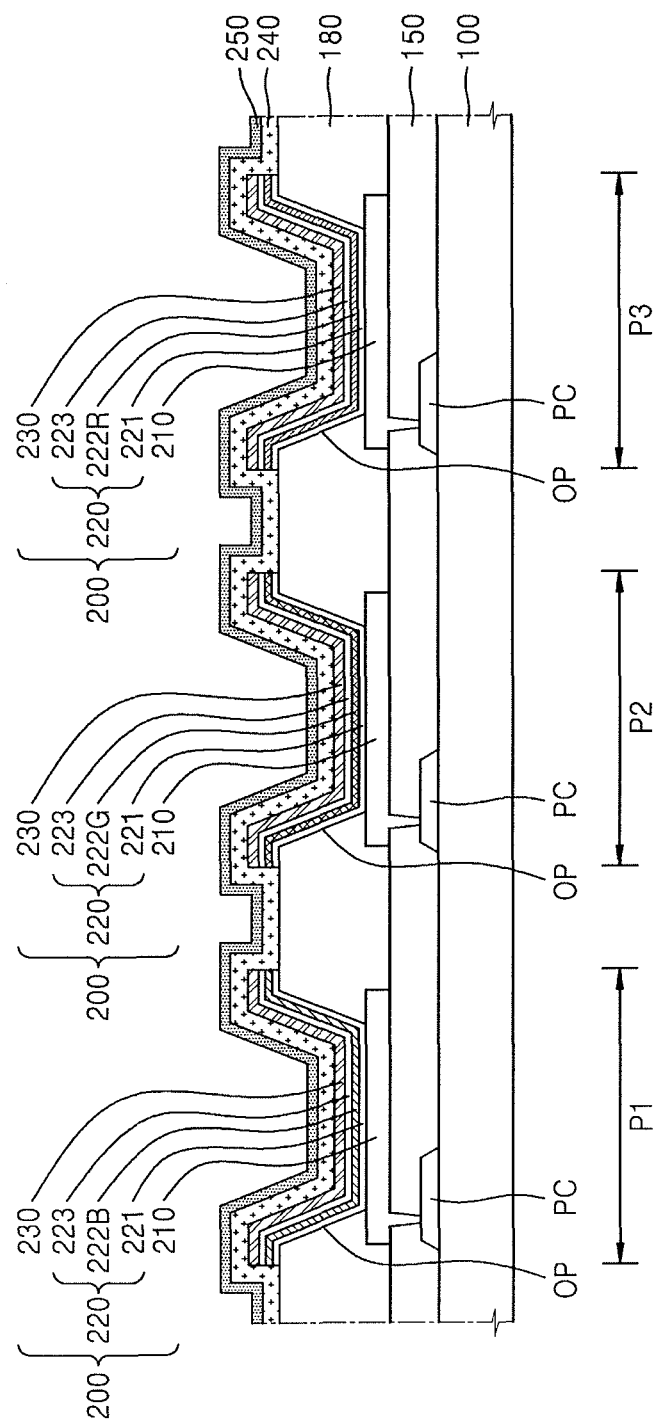
FIG. 2 illustrates a view along section line II-II in FIG. 1.

FIG. 2 illustrates a cross-sectional view taken along a line II-II of FIG. 1. Referring to FIG. 2, a pixel circuit PC is formed on a substrate 100, and an insulating layer 150 is positioned on the pixel circuit PC. The substrate 100 may include, for example, a glass material, a metal material, or a plastic material such as polyethylene terephthalate (PET), polyethylene naphthalate (PEN), or polyimide. According to one embodiment, the substrate 100 may have improved flexibility when the substrate 100 is formed of plastic material or metal material, than when the substrate 100 is formed of glass material. A buffer layer formed, for example, of $SiO_2$ and/or $SiN_x$ may be on the substrate 100 to prevent impurities from penetrating into the substrate 100.

The pixel circuit PC includes a thin-film transistor (TFT) and a capacitor, and may be electrically connected to the first electrode 210 on each of the pixel areas P1, P2, and P3. A top surface of the pixel circuit PC may be covered by the insulating layer 150 that is approximately flat.

The first electrode 210 is in each of the pixel areas P1, P2, and P3. The first electrode 210 is patterned in an island type corresponding to each of the pixel areas P1, P2, and P3. The first electrode 210 is an anode electrode serving as a reflective electrode. The first electrode 210 may be a single reflective metal layer including, for example, silver (Ag), aluminum (Al), gold (Au), platinum (Pt), chrome (Cr), or an alloy containing these. According to one embodiment, the first electrode 210 may be a double or triple layer further including, for example, an indium tin oxide (ITO) or an indium zinc oxide (IZO) on a top portion and/or a bottom portion of the above-described single reflective metal layer.

A pixel defining layer 180 includes openings OP corresponding to the pixel areas P1, P2, and P3. A top surface of the first electrode 210 is exposed through the openings OP of the pixel defining layer 180. An edge of the first electrode 210 may be covered by the pixel defining layer 180. The pixel defining layer 180 may include an organic insulating layer formed of acryl resin. The pixel defining layer 180 may increase a distance between an end portion of the first electrode 210 and the second electrode 230 and/or the end portion of the first electrode 210 and the connection electrode layer 250, thereby acting to prevent an arc or the like from being generated in the end portion of the first electrode 210.

The intermediate layer 220 is formed in each of the pixel areas P1, P2, and P3. The intermediate layer 220 may be patterned as an island type in each of the pixel areas P1, P2, and P3, and may include a first intermediate layer 221, emission layers 222B, 222G, and 222R, and a second intermediate layer 223, which are sequentially stacked.

The first intermediate layer 221 may be adjacent to the first electrode 210 and may have a single layer or multilayer structure. For example, when the first intermediate layer 221 includes a high molecular weight material, the first intermediate layer 221 may be a hole transport layer (HTL)

having a single layer structure and, for example, may include poly-(3,4)-ethylene-dihydroxy thiophene (PEDOT) or polyaniline (PANI). When the first intermediate layer 221 includes a low molecular weight material, the first intermediate layer 221 may include a hole injection layer (HIL) and the HTL.

The emission layer 222B of the first pixel area P1 may correspond to a blue color emission of light and is patterned as an island type corresponding to the first pixel area P1. According to one embodiment, the emission layer 222B of the first pixel area P1 may include a fluorescent material selected from the group consisting of DPVBi, spiro-DPVBi, spiro-6P, distyrylbenzene (DSB), distyrylarylene (DSA), a PFO-based polymer, and a PPV-based polymer. According to another embodiment, the emission layer 222B may include, as a host material, an anthracene derivative or a carbazole-based compound, and may include, as a dopant material, a phosphor material including F2Irpic, (F2ppy)2Ir (tmd), or Ir(dfppz)3.

The emission layer 222G of the second pixel area P2 may correspond to a green color emission of light and is patterned as an island type corresponding to the second pixel area P2. According to one embodiment, the emission layer 222G of the second pixel area P2 may include, as the host material, the anthracene derivative or the carbazole-based compound, and may include, as the dopant material, a phosphor material including Ir(ppy)3 (fac tris(2-phenylpyridine) iridium). According to another embodiment, the emission layer 222G may include a fluorescent material such as tris(8-hydroxyquinoline) aluminum (Alq3).

The emission layer 222R of the third pixel area P3 may correspond to a red color emission of light and is patterned as an island type corresponding to the third pixel area P3. According to one embodiment, the emission layer 222R of the third pixel area P3 may include, as the host material, the anthracene derivative or the carbazole-based compound, and may include, as the dopant material, a phosphor material including one or more materials selected from the group consisting of PIQIr(acac)(bis(1-phenylisoquinoline)acetylacetonate iridium), PQIr(acac(bis(1-phenylquinoline)acetylacetonate iridium), PQIr(tris(1-phenylquinoline) iridium), and PtPEP(octaethylporphyrin platinum). According to another embodiment, the emission layer 222R may include a fluorescent material such as PED:Eu(DBM)3(Phen) or perylene.

The second intermediate layer 223 is patterned corresponding to each of the emission layers 222B, 222G, and 222R to cover each of the emission layers 222B, 222G, and 222R. The second intermediate layer 223 may be omitted in an alternative embodiment. For example, when the first intermediate layer 221 and the emission layers 222B, 222G, and 222R include high molecular weight material, the second intermediate layer 223 may be omitted. When the first intermediate layer 221 and the emission layers 222B, 222G, and 222R include low molecular weight material, the second intermediate layer 223 may be formed in order to achieve an excellent light-emitting characteristic. In this case, the second intermediate layer 223 may have a single layer or multilayer structure and may include an electron transport layer (ETL) and/or an electron injection layer (EIL).

The second electrode 230 is formed in each of the pixel areas P1, P2, and P3. The second electrode 230 is positioned on the intermediate layer 220 and is patterned as an island type corresponding to each of the pixel areas P1, P2, and P3. The second electrode 230 is a cathode electrode with simultaneous translucency and reflectivity. For example, the second electrode 230 may include a transflective metal layer.

The second electrode 230 may transmit or reflect part of light emitted from the emission layers 222B, 222G, and 222R by appropriately adjusting a thickness of the transflective metal layer. According to one exemplary embodiment, the second electrode 230 may form a micro-cavity structure with the first electrode 210 and/or the connection electrode layer 250, to thereby improve light efficiency of an organic light emitting display device.

According to an embodiment, the second electrode 230 may include, for example, Ag and Mg. For example, the second electrode 230 may be formed of an Ag—Mg alloy in which an amount of Ag is higher than an amount of Mg. According to another embodiment, the second electrode 230 may include any one selected from magnesium (Mg), silver (Ag), lithium (Li), sodium (Na), calcium (Ca), strontium (Sr), and an alloy of theses.

The conductive protection layer 240 may be on the second electrode 230. The conductive protection layer 240 electrically connects the second electrode 230 patterned in each of the pixel areas P1, P2, and P3 to the connection electrode layer 250, and has translucency such that light emitted from the emission layers 222B, 222G, and 222R may be emitted to the outside. The conductive protection layer 240 may include, for example, an oxide such as ITO, IZO, WOx, MoOx, and InOx or a conductive polymer such as PEDOT, and may be formed as a single layer or a multilayer.

The conductive protection layer 240 may be integrally formed to cover the second electrode 230 of each of the pixel areas P1, P2, and P3. The conductive protection layer 240 may cover a display area. The display area correspond, for example, to all areas in which the organic light emitting display device may emit light, e.g., all areas except for an edge of the organic light emitting display device in which a controller is disposed. When a dead area is not present in an entire surface of the organic light emitting display device, the entire surface of the organic light emitting display device may be the display area.

The connection electrode layer 250 may be integrally formed with respect to the pixel areas P1, P2, and P3 to cover the display area, and electrically connects the second electrodes 230 patterned as an island type corresponding to pixel areas P1, P2, and P3.

The connection electrode layer 250 may be simultaneously translucent and reflective. For example, the connection electrode layer 250 may include the transflective metal layer. The connection electrode layer 250 may transmit or reflect part of light emitted from the emission layers 222B, 222G, and 222R by appropriately adjusting a thickness of the transflective metal layer. The connection electrode layer 250 may form the micro-cavity structure with the first electrode 210 and/or the second electrode 230, thereby improving light efficiency of the organic light emitting display device.

According to an embodiment, the connection electrode layer 250 may include, for example, Ag and Mg. For example, the connection electrode layer 250 may include an Ag—Mg alloy in which an amount of Ag is higher than an amount of Mg. According to another embodiment, the connection electrode layer 250 may include any one selected from magnesium (Mg), silver (Ag), lithium (Li), sodium (Na), calcium (Ca), strontium (Sr), and an alloy of these.

The intermediate layer 220 and the second electrode 230 are patterned as an island type corresponding to each of the pixel areas P1, P2, and P3, whereas the conductive protection layer 240 and the connection electrode layer 250 are integrally formed with respect to the pixel areas P1, P2, and P3. Thus, part of the top surface of the pixel defining layer 180 between or among the pixel areas P1, P2, and P3 may be in direct contact with the conductive protection layer 240.

At least one of the pixel areas P1, P2, and P3 may have an optical resonance structure, e.g., a micro-cavity.

According to an embodiment, one of the pixel areas P1, P2, and P3 may have a first optical resonance distance between the second electrode 230 and the connection electrode layer 250, e.g., from the second electrode 230 to the connection electrode layer 250. For example, the conductive protection layer 240 may have a thickness corresponding to an optical resonance distance of light realized in one of the pixel areas P1, P2, and P3, for example, in the first pixel area P1.

The intermediate layer 220 and the second electrode 230 may be independently patterned in each of the pixel areas P1, P2, and P3 during manufacture. Thus, a thickness of the intermediate layer 220 and a thickness of the second electrode 230 of each of the pixel areas P1, P2, and P3 may be independently selected, e.g., the thicknesses may have different values.

Each of the pixel areas P1, P2, and P3 may have a second optical resonance distance from the first electrode 210 to the second electrode 230 and/or a third optical resonance distance from the first electrode 210 to the connection electrode layer 250, by adjusting the thicknesses of the intermediate layer 220 and/or the second electrode 230.

The thicknesses of the second electrode layer 230 and the connection electrode layer 250 may have values smaller than that of the conductive protection layer 240. For example, the thickness of the conductive protection layer 240 may be greater than those of the second electrode 230 and the connection electrode layer 250. When the thicknesses of the second electrode 230 and the connection electrode layer 250 that are formed of metal are large (e.g., greater than one or more corresponding predetermined value), in particular, when the thickness of the connection electrode layer 250 integrally formed with respect to the pixel areas P1, P2, and P3 is large, the resistance of the connection electrode layer 250 may be reduced, translucency may be reduced, and thus light efficiency of the organic light emitting display device may deteriorate. However, according to an embodiment, the thickness of the conductive protection layer 240 is relatively thick and the thicknesses of the second electrode 230 and the connection electrode layer 250 are relatively thin, thereby improving translucency while reducing resistance.

FIGS. 3 to 13 illustrate cross-sectional views of different stages of an embodiment of a method for manufacturing an organic light emitting display device, for example, the one in FIG. 2.

Figure 3:
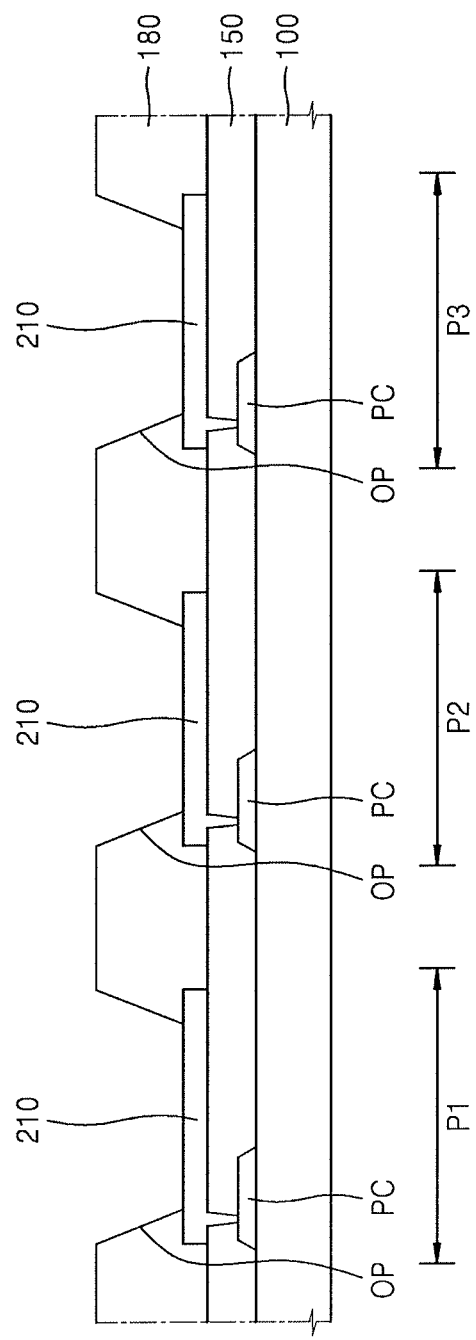
FIGS. 3 through 13 illustrate different stages of an embodiment of a method for manufacturing an organic light emitting display device.

Referring to FIG. 3, the substrate 100 including the pixel areas P1, P2, and P3 is prepared. A buffer layer is disposed on the substrate 100 to prevent impurities from penetrating into the substrate 100. The pixel circuit PC including a TFT and a capacitor is formed on the buffer layer. The pixel circuit PC is formed in each of the pixel areas P1, P2, and P3 and may have a top surface covered by the insulating layer 150 that is approximately flat.

Thereafter, the first electrode 210 is formed in each of the pixel areas P1, P2, and P3 by forming and patterning a metal layer on the insulating layer 150. The first electrode 210 is patterned as an island type corresponding to each of the pixel areas P1, P2, and P3. The first electrode 210 is a reflective electrode. According to an embodiment, the first electrode 210 may be a single reflective metal layer including silver (Ag), aluminum (Al), gold (Au), platinum (Pt), chromium (Cr), or an alloy containing these. According to another embodiment, the first electrode 210 may be formed as a double or triple layer further including an ITO or an IZO on a top portion and/or a bottom portion of the above-described single reflective metal layer.

The pixel defining layer 180 is formed by forming and patterning an organic insulating layer on the substrate 100 on which the first electrode 210 is formed. The pixel defining layer 180 includes the openings OP that exposes at least a part of a top surface of the first electrode 210.

Figure 4:
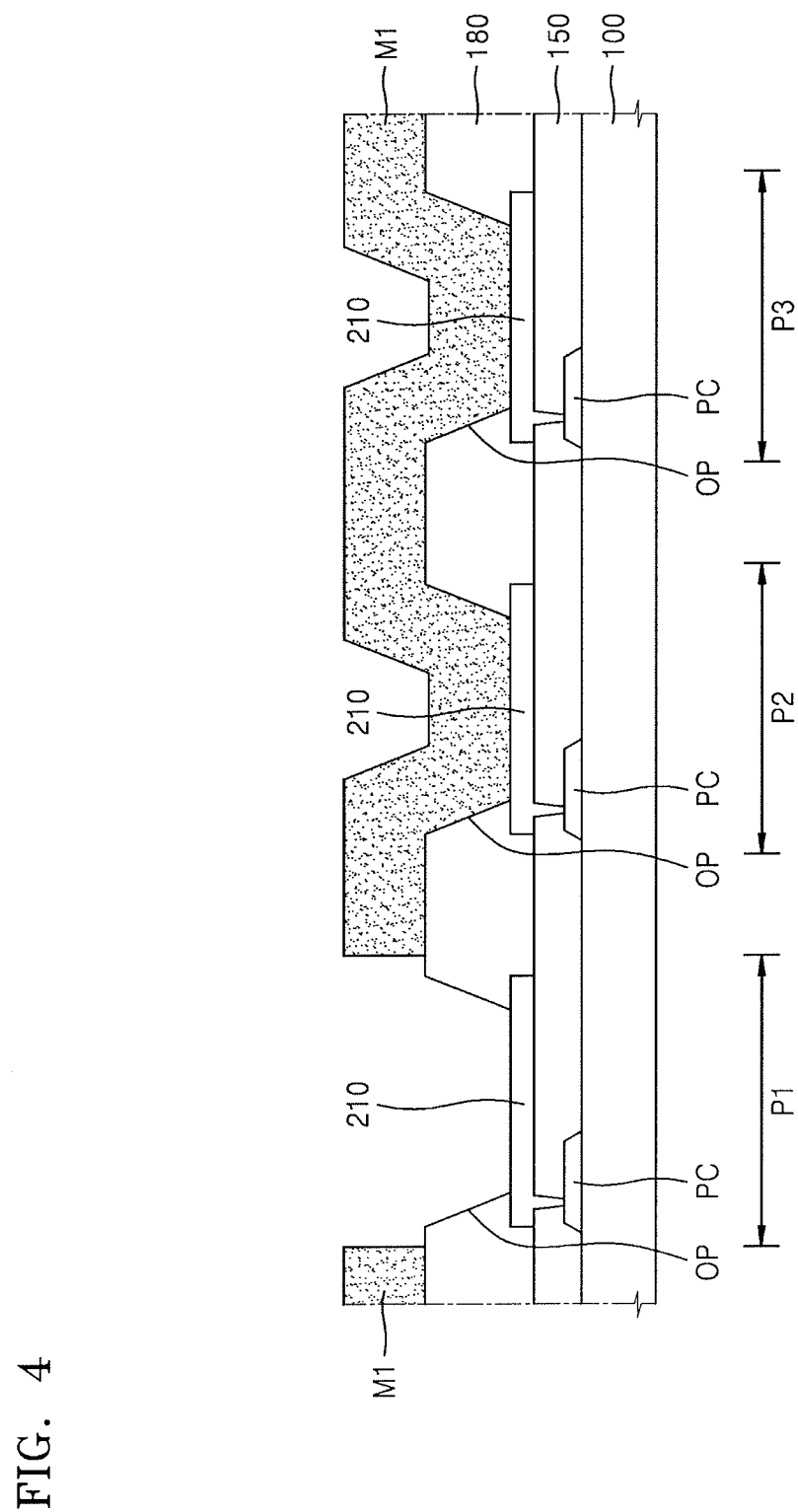

Referring to FIG. 4, a first masking pattern M1 is formed to cover the pixels units P2 and P3 except for the first pixel area P1. The first masking patterns M1 may include a polymer material. The type of material of the first masking patterns M1 may be different in another embodiment, as long as the material may be well resolved in a solvent during a lift-off process that will be described later and may reduce or minimize an influence on the intermediate layer 220.

Figure 5:
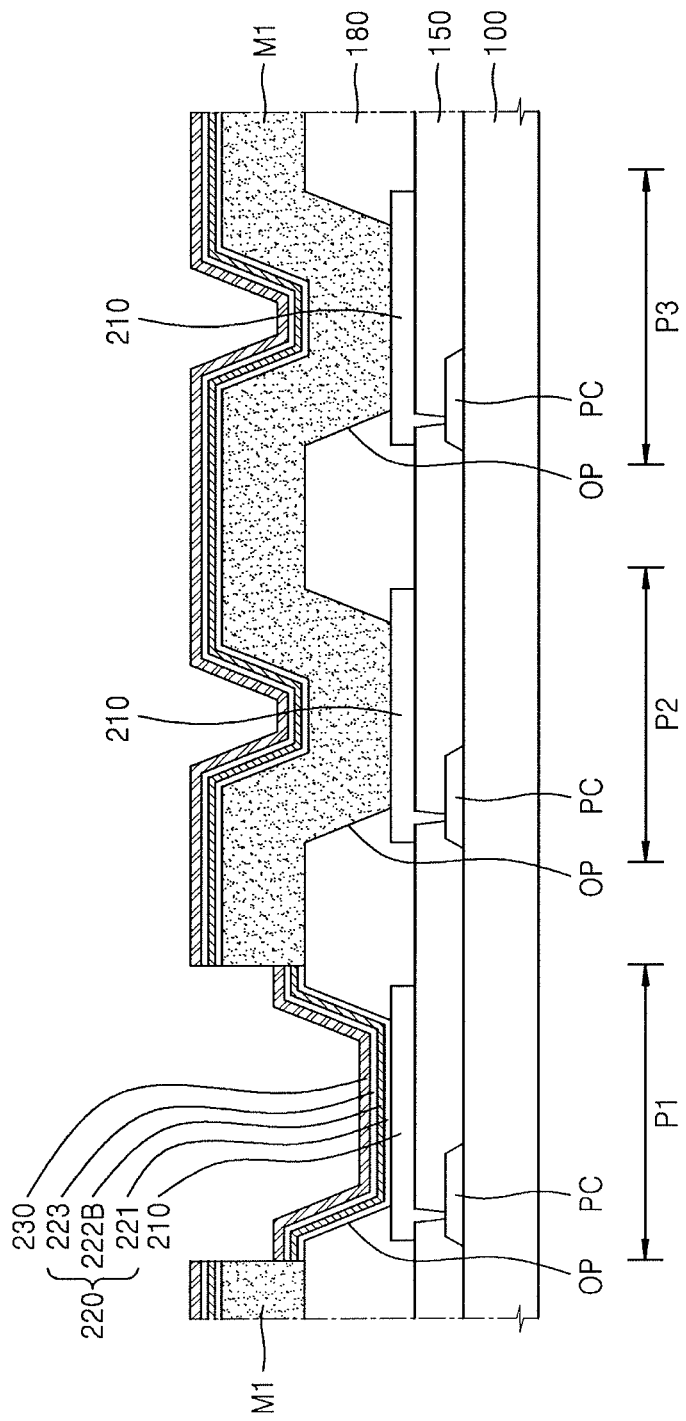

Referring to FIG. 5, the intermediate layer 220 and the second electrode 230 are sequentially formed on the substrate 100 on which the first masking pattern M1 is provided. The intermediate layer 220 may include the first intermediate layer 221, the emission layer 222B realizing a blue color, and the second intermediate layer 223.

The first intermediate layer 221 may be a HTL having a single layer structure. According to another embodiment, the first intermediate layer 221 may include a HIL adjacent to the first electrode 210 and the HTL positioned on the HIL.

The emission layer 222B may include, as a material corresponding to blue color emission of light, a fluorescent material including a material selected from the group consisting of DPVBi, spiro-DPVBi, spiro-6P, distyrylbenzene (DSB), distyrylarylene (DSA), a PFO-based polymer, and a PPV-based polymer. According to another embodiment, the emission layer 222B may include, as a host material, an anthracene derivative or a carbazole-based compound, and may include, as a dopant material, a phosphor material including F2Irpic, (F2ppy)2Ir(tmd), or Ir(dfppz)3.

The second intermediate layer 223 may include an ETL and/or an EIL. When the first intermediate layer 221 and the emission layer 222B include a polymer material, the second intermediate layer 223 may be omitted.

The second electrode 230 may serve as a transflective metal layer. According to one embodiment, the second electrode 230 may include, for example, Ag and Mg. For example, the second electrode 230 may include an Ag—Mg alloy in which an amount of Ag is higher than an amount of Mg. According to another embodiment, the second electrode 230 may include any one selected from magnesium (Mg), silver (Ag), lithium (Li), sodium (Na), calcium (Ca), strontium (Sr), and an alloy of these.

According to an embodiment, the thickness of the first masking pattern M1 may be greater than a sum of thicknesses of the intermediate layer 220 and the second electrode 230. Thus, the intermediate layer 220 and the second electrode 230 on the first pixel area P1 may be discontinuously formed with the intermediate layer 220 and the second electrode 230 on the first masking pattern M1.

Figure 6:
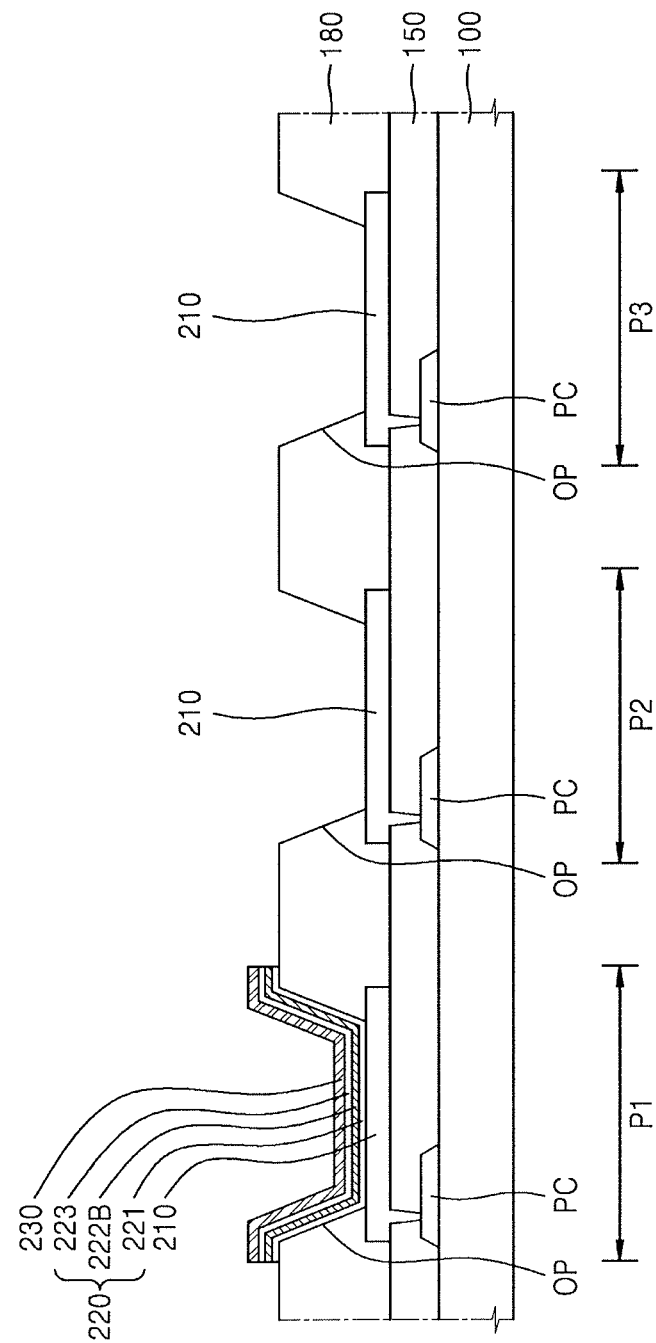

Referring to FIG. 6, the first masking pattern M1 is removed through the lift-off process. When the first masking pattern M1 is removed, the intermediate layer 220 and the second electrode 230 that are patterned as an island type remain on the first pixel area P1.

Figure 7:
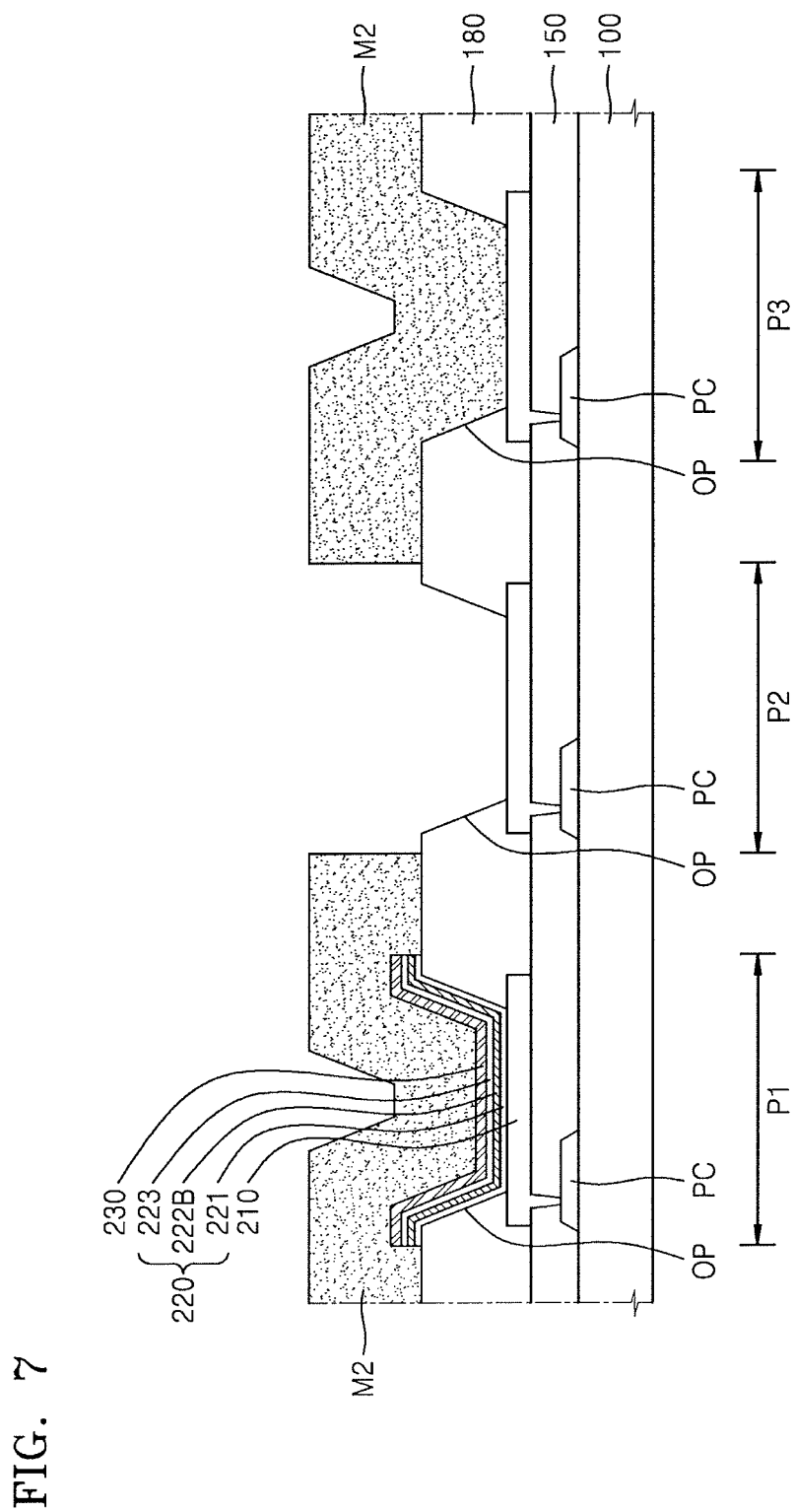

Referring to FIG. 7, a second masking pattern M2 is formed to cover the pixels units P1 and P3 except for the second pixel area P2. The second masking pattern M2 may include a polymer material. However, the type of material of the second masking pattern M2 may be different in another embodiment, as long as the material may be well resolved in the solvent during the lift-off process that will be described later and may reduce or minimize an influence on the intermediate layer 220.

Figure 8:
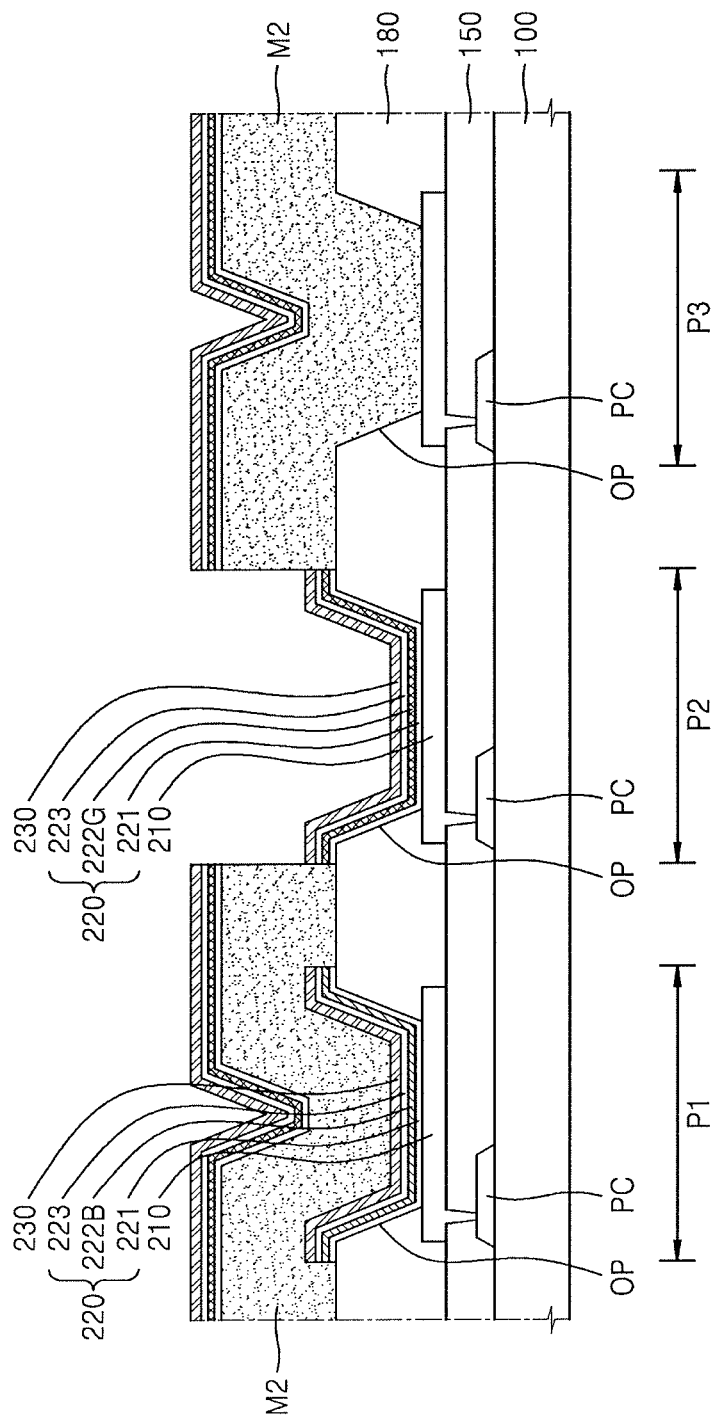

Referring to FIG. 8, the intermediate layer 220 and the second electrode 230 are sequentially formed on the substrate 100 on which the second masking pattern M2 is provided. The intermediate layer 220 may include the first intermediate layer 221, the emission layer 222G realizing a green color, and the second intermediate layer 223.

The first intermediate layer 221 may be formed as the HTL having the single layer structure. According to another embodiment, the first intermediate layer 221 may include the HIL adjacent to the first electrode 210 and the HTL positioned on the HIL. The second intermediate layer 223 may include or omit the ETL and/or the EIL.

The emission layer 222G may include, as a host material, an anthracene derivative or a carbazole-based compound, and may include, as a dopant material, a phosphor material including Ir(ppy)3 (fac tris(2-phenylpyridine) iridium). According to another embodiment, the emission layer 222G may include a fluorescent material such as tris(8-hydroxyquinoline) aluminum (Alq3).

The second electrode 230 may be formed as the transflective metal layer. According to one embodiment, the second electrode 230 may include, for example, Ag and Mg. For example, the second electrode 230 may include an Ag—Mg alloy in which an amount of Ag is higher than an amount of Mg. According to another embodiment, the second electrode 230 may include any one selected from magnesium (Mg), silver (Ag), lithium (Li), sodium (Na), calcium (Ca), strontium (Sr), and an alloy of these.

According to an embodiment, the thickness of the second masking pattern M2 may be greater than the sum of thicknesses of the intermediate layer 220 and the second electrode 230. Thus, the intermediate layer 220 and the second electrode 230 on the second pixel area P2 may be discontinuously formed with the intermediate layer 220 and the second electrode 230 on the second masking pattern M2.

Figure 9:
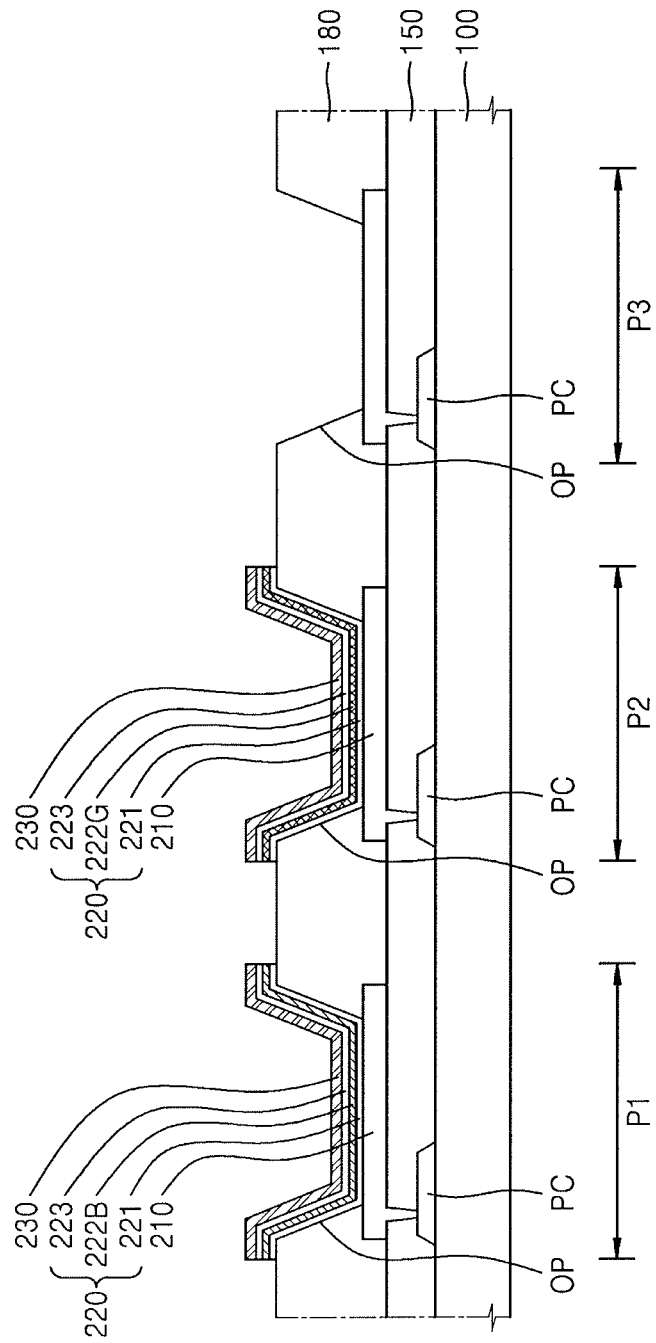

Referring to FIG. 9, the second masking pattern M2 may be removed through a lift-off process. When the second masking pattern M2 is removed, the intermediate layer 220 and the second electrode 230 that are patterned as an island type remain on the second pixel area P2.

Figure 10:
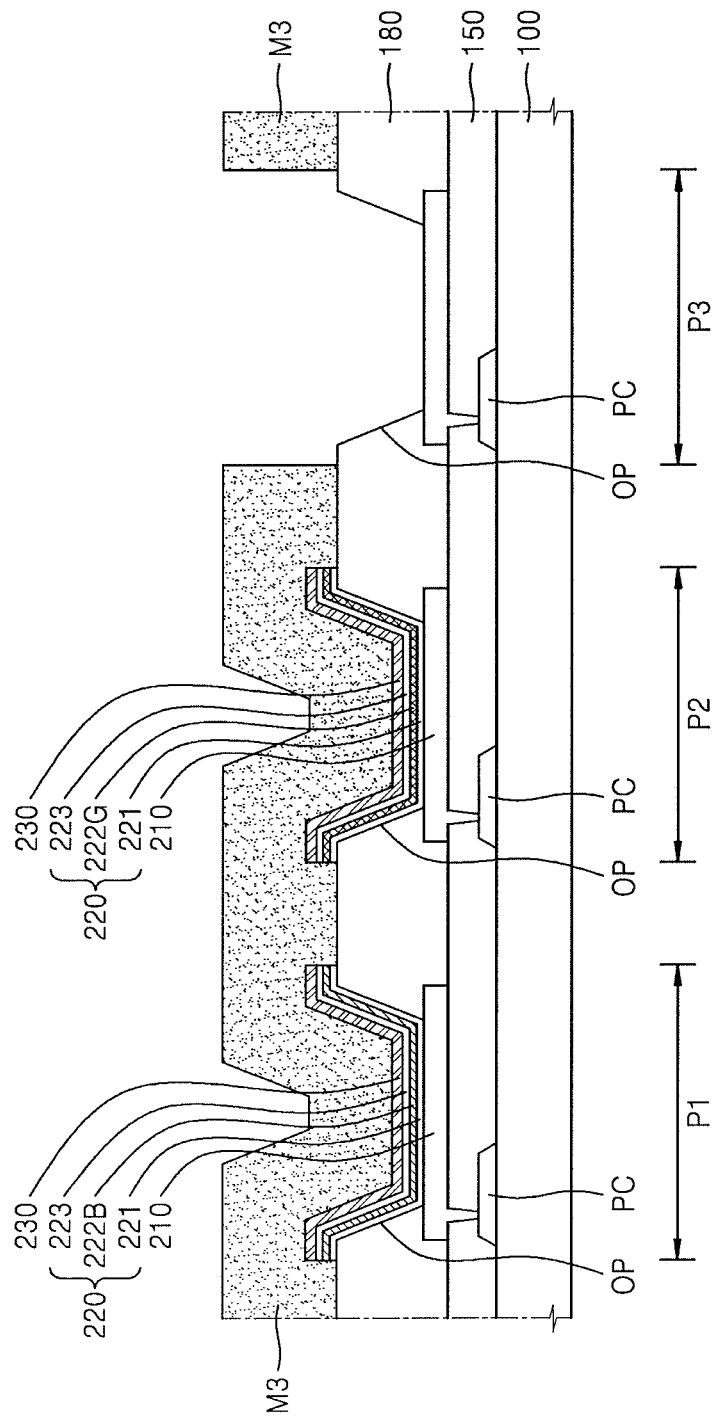

Referring to FIG. 10, a third masking pattern M3 is formed to cover the pixels units P1 and P2 except for the third pixel area P3. The third masking pattern M3 may include a polymer material. However, the type of a material of the second masking pattern M2 may be different in another embodiment, as long as the material may be well resolved in the solvent during the lift-off process that will be described later and may reduce or minimize an influence on the intermediate layer 220.

Figure 11:
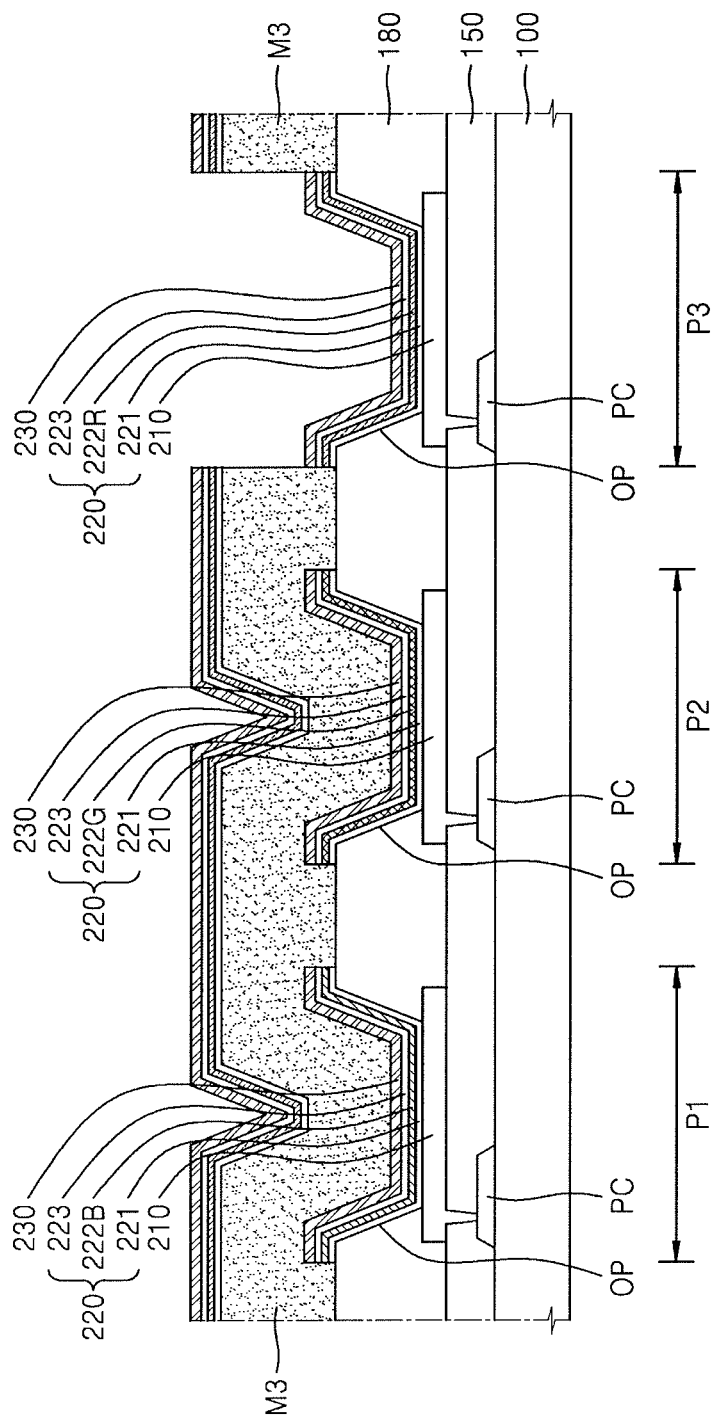

Referring to FIG. 11, the intermediate layer 220 and the second electrode 230 are sequentially formed on the substrate 100 on which the third masking pattern M3 is provided. The intermediate layer 220 may include the first intermediate layer 221, the emission layer 222R realizing a red color, and the second intermediate layer 223.

The first intermediate layer 221 may be formed as the HTL having the single layer structure. According to another embodiment, the first intermediate layer 221 may include the HIL adjacent to the first electrode 210 and the HTL positioned on the HIL. The second intermediate layer 223 may include or omit the ETL and/or the EIL.

The emission layer 222R may include, as the host material, the anthracene derivative or the carbazole-based compound, and may include, as a dopant material, a phosphor material including one or more materials selected from the group consisting of PIQIr(acac)(bis(1-phenylisoquinoline) acetylacetonate iridium), PQIr(acac(bis(1-phenylquinoline) acetylacetonate iridium), PQIr(tris(1-phenylquinoline) iridium), and PtPEP(octaethylporphyrin platinum). According to another embodiment, the emission layer 222R may include a fluorescent material such as PED:Eu(DBM)3 (Phen) or perylene.

The second electrode 230 may be formed as the transflective metal layer. According to some embodiments, the second electrode 230 may include, for example, Ag and Mg. For example, the second electrode 230 may include an Ag—Mg alloy in which an amount of Ag is higher than an amount of Mg. According to another embodiment, the second electrode 230 may include any one selected from magnesium (Mg), silver (Ag), lithium (Li), sodium (Na), calcium (Ca), strontium (Sr), and an alloy of these.

According to an embodiment, the thickness of the third masking pattern M3 may be greater than the sum of thicknesses of the intermediate layer 220 and the second electrode 230. Thus, the intermediate layer 220 and the second electrode 230 formed on the third pixel area P3 may be discontinuously formed with the intermediate layer 220 and the second electrode 230 formed on the third masking pattern M3.

Figure 12:
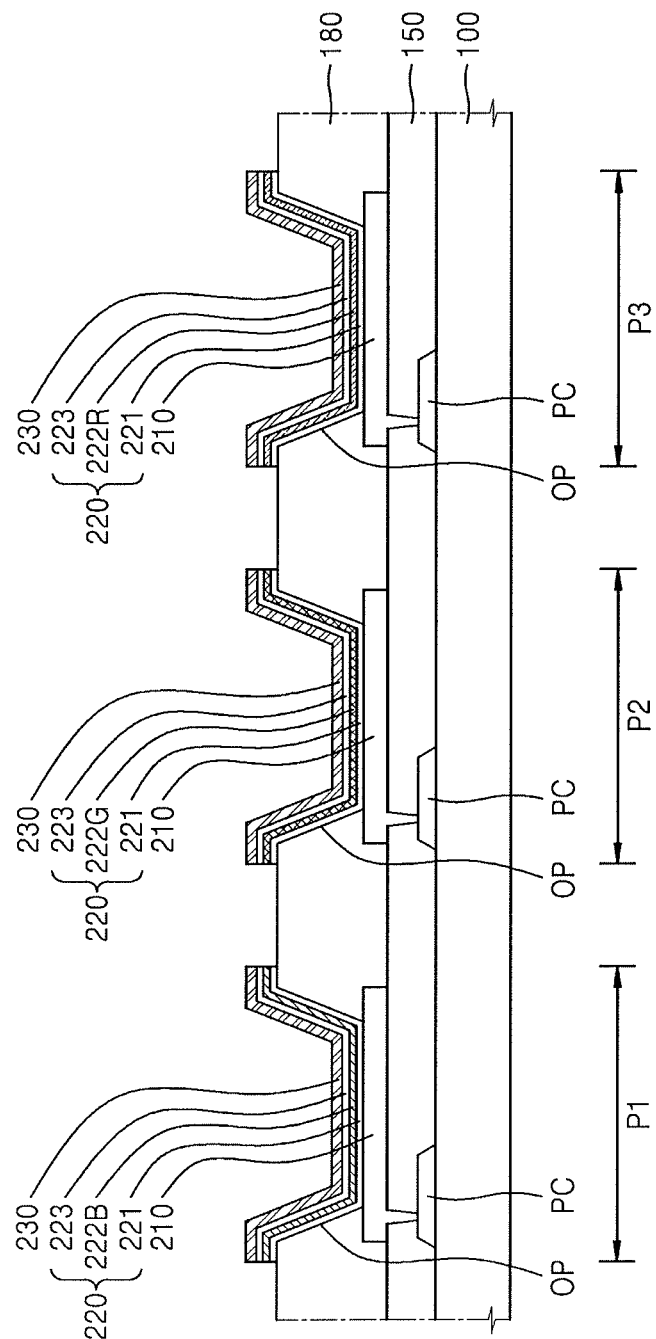

Referring to FIG. 12, the third masking pattern M3 is removed through the lift-off process. When the third masking pattern M3 is removed, the intermediate layer 220 and the second electrode 230 that are patterned as an island type remain on the third pixel area P3.

Figure 13:
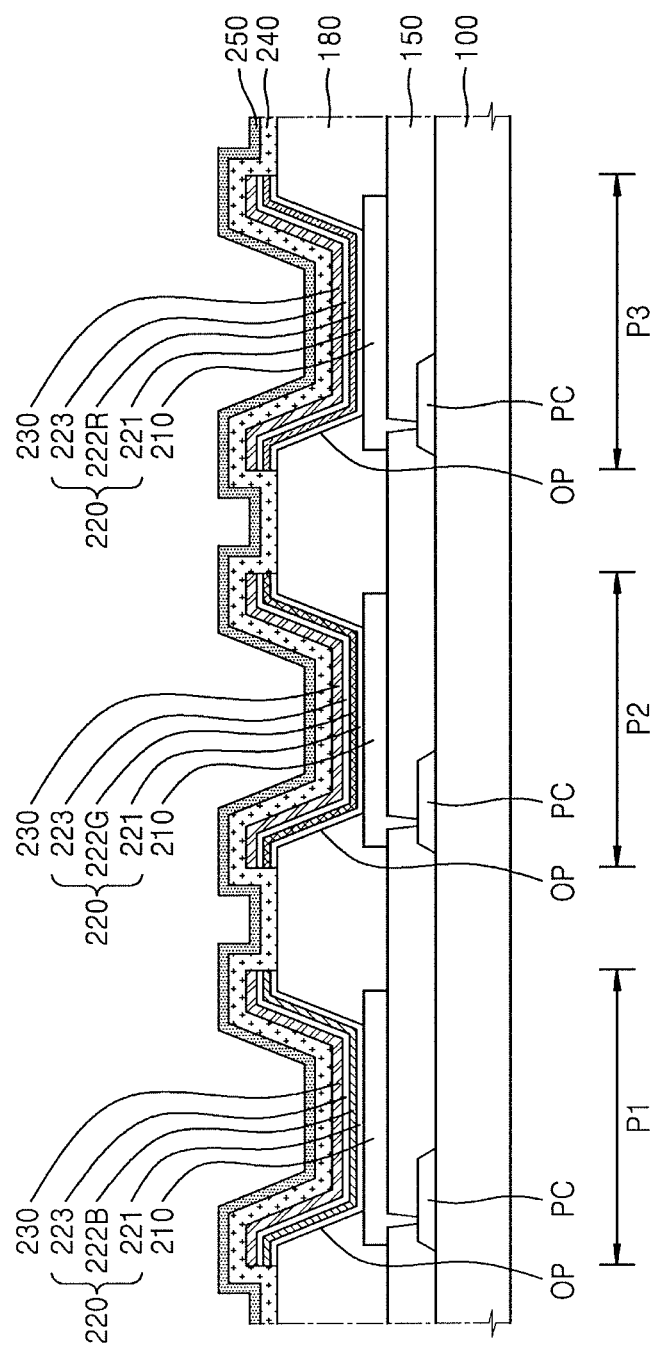

Referring to FIG. 13, the conductive protection layer 240 and the connection electrode layer 250 that are integrally formed to cover the pixel areas P1, P2, and P3 are formed on the intermediate layer 220 and the second electrode 230 that are patterned as an island type in each of the pixel areas P1, P2, and P3.

The conductive protection layer 240 includes a translucent material such that light emitted from the emission layers 222B, 222G, and 222R may travel. For example, the conductive protection layer 240 may include an oxide such as ITO, IZO, WOx, MoOx, and InOx or a conductive polymer such as PEDOT.

The connection electrode layer 250 may be formed as the transflective metal layer. According to one embodiment, the connection electrode layer 250 may include, for example. Ag and Mg. For example, the connection electrode layer 250 may include, for example, an Ag—Mg alloy in which an amount of Ag is higher than an amount of Mg. According to another embodiment, the connection electrode layer 250 may include any one selected from magnesium (Mg), silver (Ag), lithium (Li), sodium (Na), calcium (Ca), strontium (Sr), and an alloy of these.

Thicknesses of the second electrode 230 and the connection electrode layer 250 may be smaller than that of the conductive protection layer 240.

The conductive protection layer 240 may have a thickness corresponding to an optical resonance distance of one of the one of the pixel areas P1, P2, and P3. According to one embodiment, the conductive protection layer 240 may have a thickness corresponding to an optical resonance distance of blue light, and thus a micro-cavity may be formed between the second electrode 230 and the connection electrode layer 250 of the first pixel area P1.

As described with reference to FIGS. 4 to 12, the intermediate layer 220 and the second electrode 230 of each of the pixel areas P1, P2, and P3 are formed through separate processes. Thus, the thicknesses of the intermediate layer 220 and the second electrode 230 of each of the pixel areas P1, P2, and P3 may be independently formed. The thicknesses of the intermediate layer 220 and/or the second electrode 230 are differently formed in each of the pixel areas P1, P2, and P3. Thus, an optical resonance distance corresponding to a color that is to be realized in a corresponding pixel area may be formed in each of the pixel areas P1, P2, and P3.

According to one non-limiting embodiment, the first pixel area P1 realizing a blue color having relatively low efficiency may have a first optical resonance distance between the second electrode 230 and the connection electrode layer 250 by controlling a thickness of the conductive protection layer 240, and may have second and third optical resonance distances respectively formed between the first electrode 210 and the second electrode 230 and between the first electrode 210 and the connection electrode layer 250 by controlling thicknesses of the intermediate layer 220 and/or the second electrode layer 230. The second and third pixel areas P2 and P3 may have optical resonance distances respectively between the first electrode 210 and the second electrode 230 and between the first electrode 210 and the connection electrode layer 250 by controlling the thicknesses of the intermediate layer 220 and/or the second electrode layer 230 of each of the second and third pixel areas P2 and P3.

Figure 14:
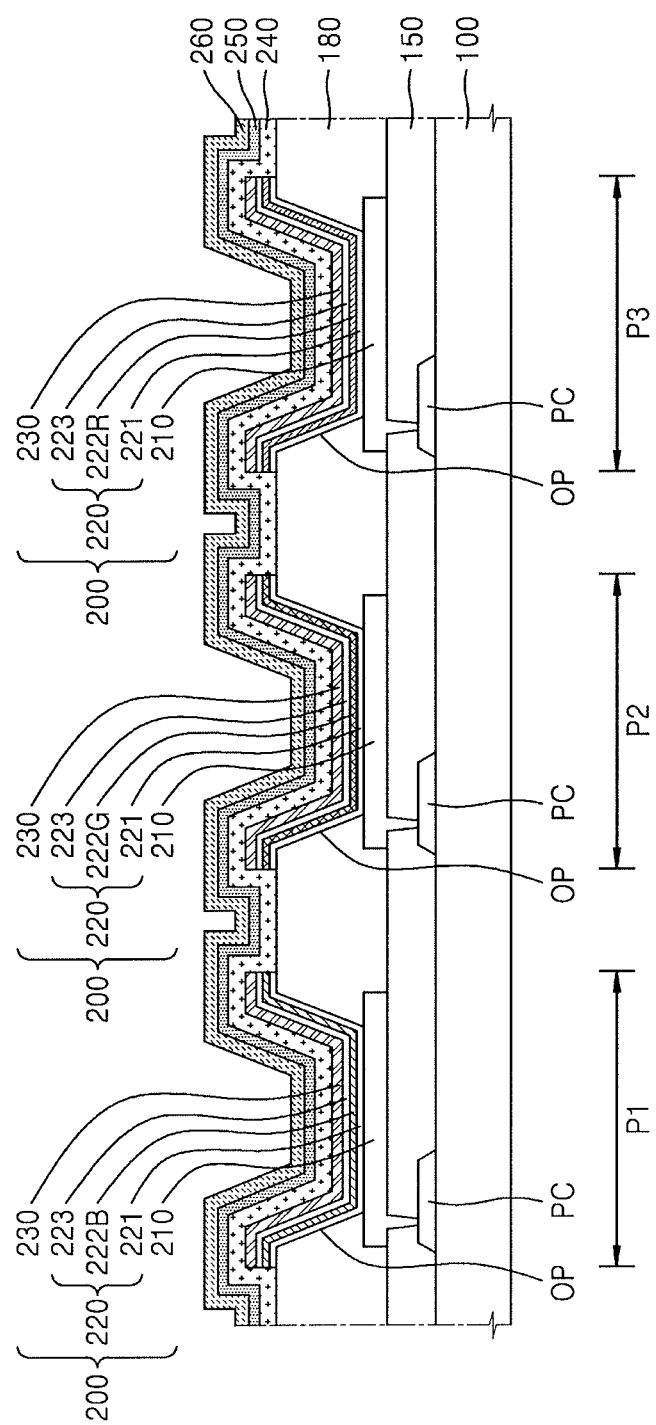
FIG. 14 illustrates another embodiment of an organic light emitting display.

FIG. 14 illustrates a cross-sectional view of another embodiment of an organic light emitting display device. Referring to FIG. 14, the organic light emitting display device may include a protection layer 260 on the connection electrode layer 250. When the connection electrode layer 250 formed as a transflective metal layer is exposed to oxygen during a manufacturing process of the organic light emitting display device, its translucency may deteriorate since the connection electrode layer 250 is oxidized. To prevent this, the organic light emitting display device may include protection layer 260 that may include an organic material and/or an inorganic material having translucency.

Figure 15:
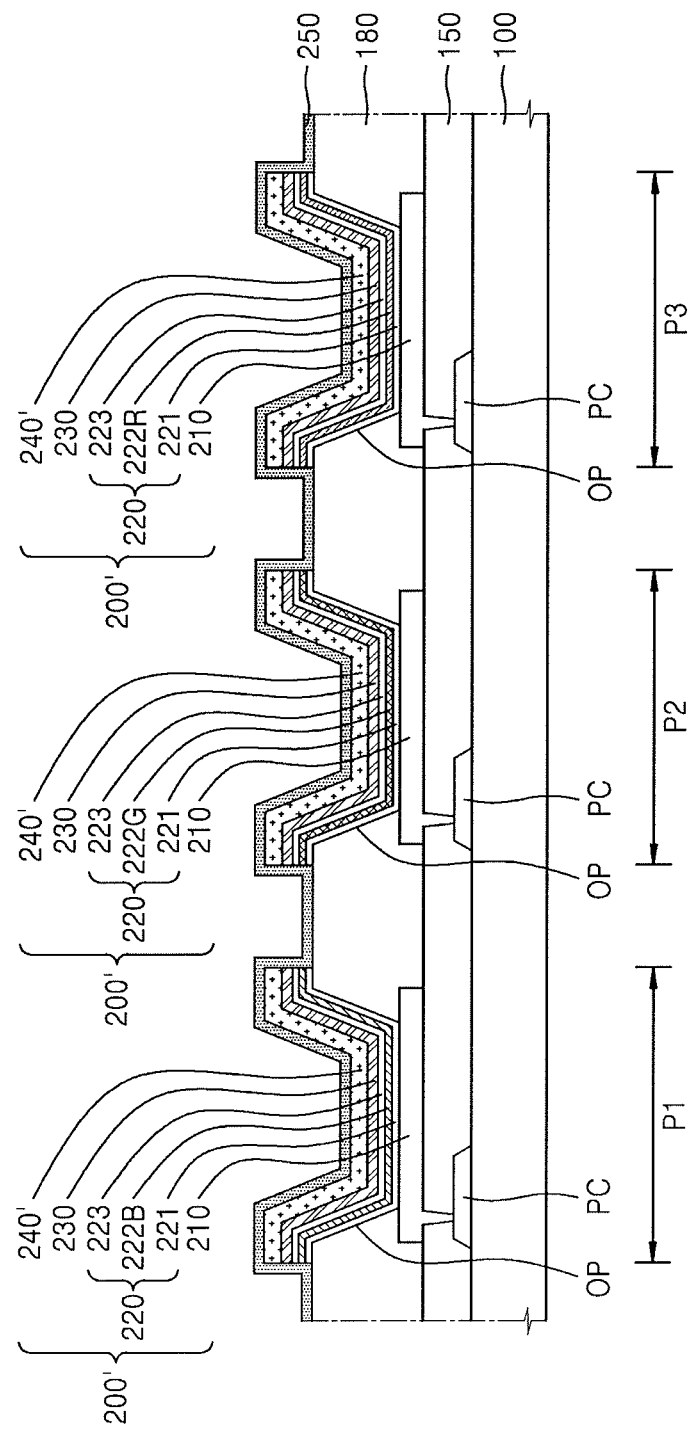
FIG. 15 illustrates another embodiment of an organic light emitting display.

FIG. 15 illustrates a cross-sectional view of another embodiment of an organic light emitting display device. Referring to FIG. 15, a conductive protection layer 240' may be patterned as an island type corresponding to each of the pixel areas P1, P2, and P3. The conductive protection layer 240' may be patterned together with the intermediate layer 220 and the second electrode 230, so that the intermediate layer 220, the second electrode 230, and the conductive protection layer 240' may have substantially a same pattern. Thus, a stack structure 200' including the first electrode 210, the intermediate layer 220, the second electrode 230, and the conductive protection layer 240' is positioned in each of the pixel areas P1, P2, and P3.

The intermediate layer 220, the second electrode 230, and the conductive protection layer 240' are patterned as the island type corresponding to each of the pixel areas P1, P2, and P3. The connection electrode layer 250 is integrally formed with respect to the pixel areas P1, P2, and P3. Thus, part of a top surface of the pixel defining layer 180 between or among the pixel areas P1, P2, and P3 may be in direct contact with the connection electrode layer 250.

In the organic light emitting display device described with reference to FIG. 2, the conductive protection layer 240 is integrally formed with respect to the pixel areas P1, P2, and P3. Thus, a first optical resonance distance formed between the second electrode 230 and the connection electrode layer 250 by adjusting a thickness of the conductive protection layer 240 may be determined in consideration of to light to be emitted from one of the pixel areas P1, P2, and P3.

However, in accordance with one or more embodiments of the organic light emitting display device, the conductive protection layer 240' is patterned in each of the pixel areas P1, P2, and P3. Thus, a thickness of the conductive protection layer 240' may be independently controlled in each of the pixel areas P1, P2, and P3. Thus, each of the pixel areas P1, P2, and P3 may set an optical resonance distance from the second electrode 230 to the connection electrode layer 250 by adjusting the thickness of the conductive protection layer 240' patterned in correspondence to a corresponding pixel.

FIGS. 16 to 22 illustrate cross-sectional views of different stages of an embodiment of a method for manufacturing the organic light emitting display device of FIG. 15.

Figure 16:
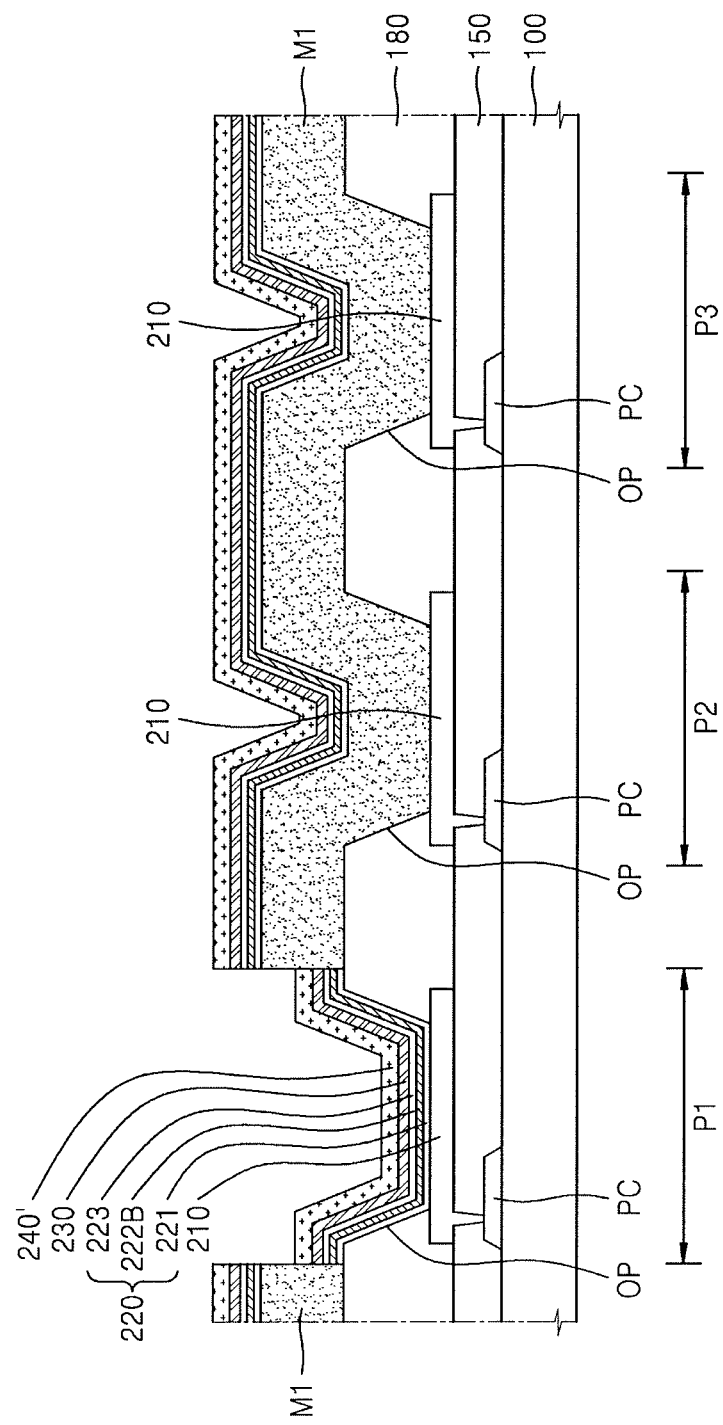
FIGS. 16 through 22 illustrate different stages in an embodiment of a method for manufacturing the organic light emitting display device in FIG. 15.

Referring to FIG. 16, the first masking pattern M1 is formed on the substrate 100 in which the pixel circuit PC and the first electrode 210 are formed. The first masking pattern M1 covers the pixel areas P2 and P3 except for the first pixel area P1.

The intermediate layer 220, the second electrode 230, and the conductive protection layer 240' are sequentially formed on the substrate 100 on which the first masking pattern M1 is formed. The intermediate layer 220 may include the first intermediate layer 221, the emission layer 222B emitting blue color light, and the second intermediate layer 223. The detailed configuration of the intermediate layer 220, the second electrode 230, and the conductive protection layer 240' may be the same as described above.

According to an embodiment, the thickness of the first masking pattern M1 may be greater than a sum of thicknesses of the intermediate layer 220, the second electrode 230, and the conductive protection layer 240'. Thus, the intermediate layer 220, the second electrode 230, and the conductive protection layer 240' on the first pixel area P1 may be discontinuously formed with the intermediate layer 220, the second electrode 230, and the conductive protection layer 240' formed on the first masking pattern M1.

Figure 17:
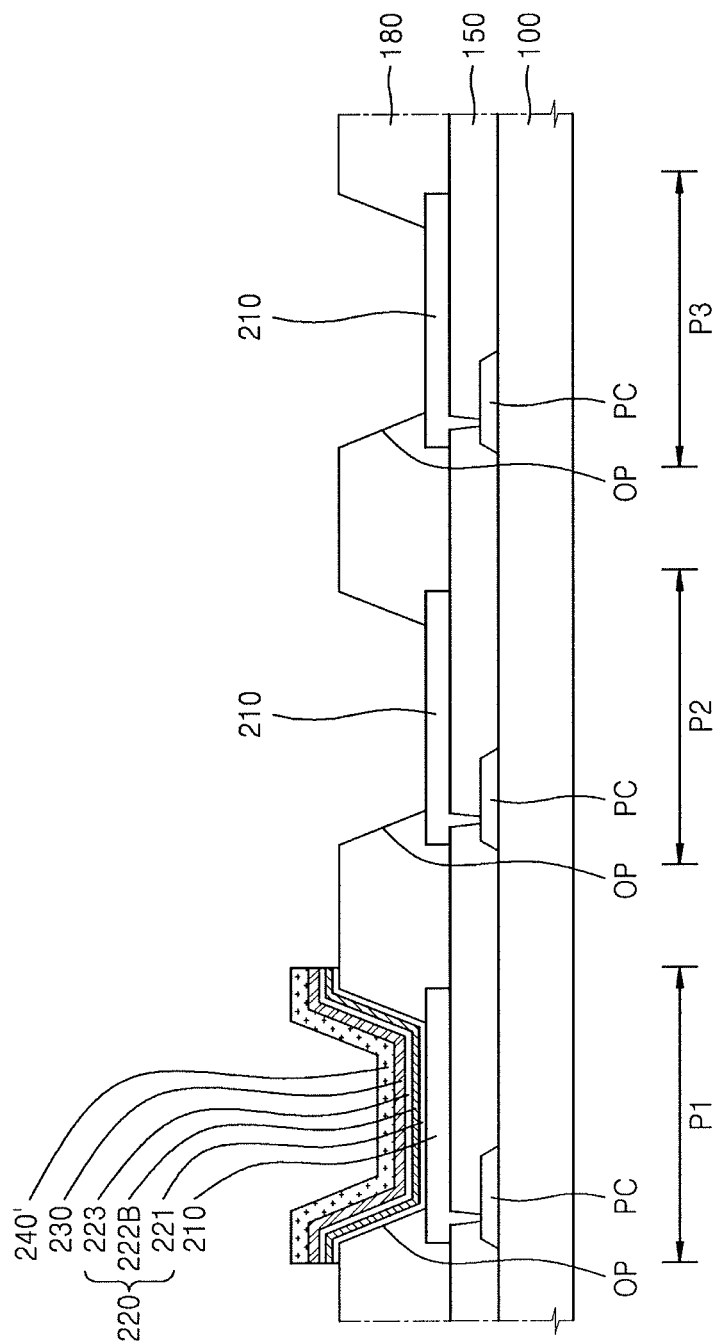

Referring to FIG. 17, the first masking pattern M1 is removed through a lift-off process. When the first masking pattern M1 is removed, the intermediate layer 220, the second electrode 230, and the conductive protection layer 240' that are patterned as an island type remain on the first pixel area P1.

Figure 18:
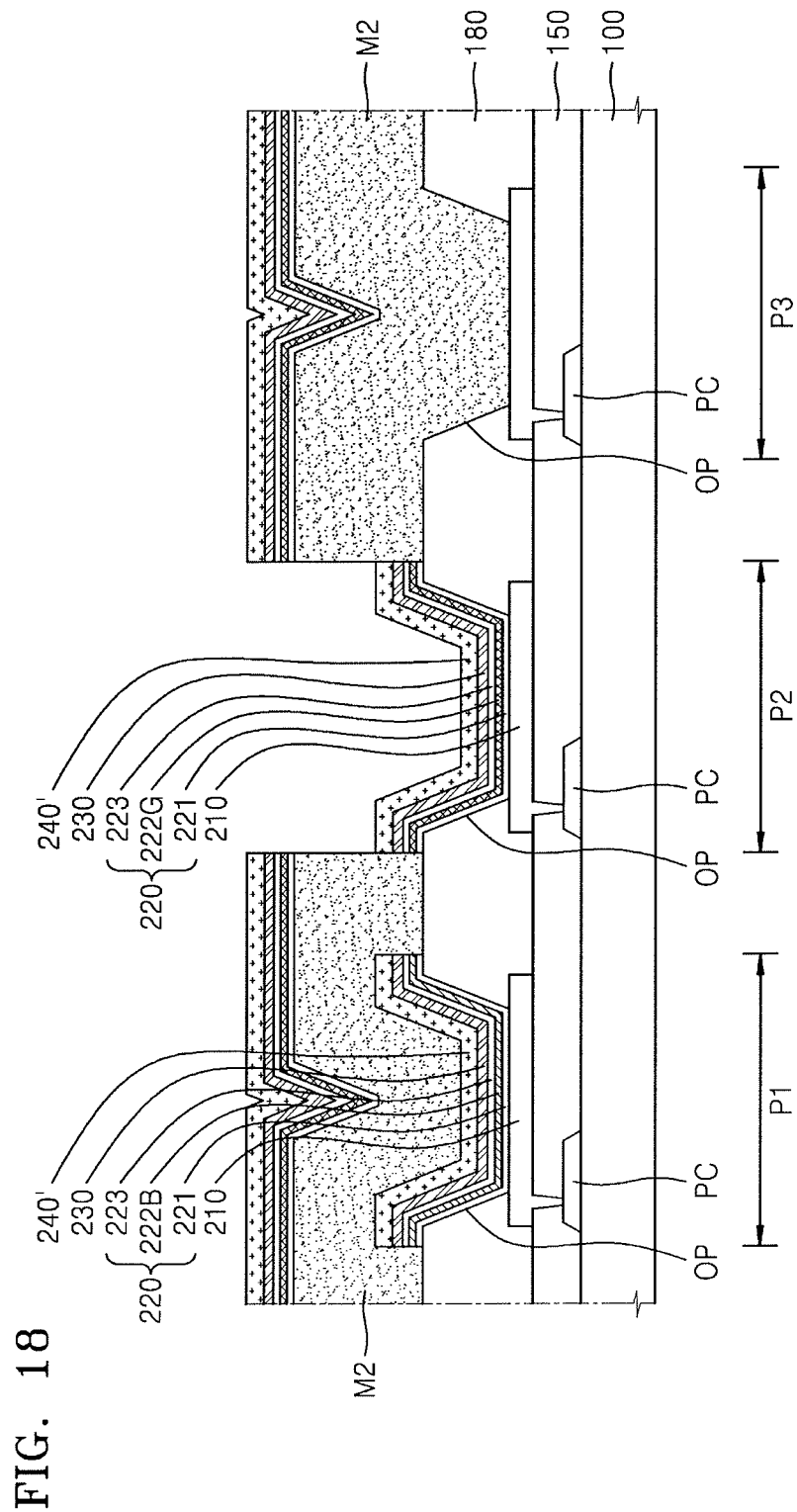

Referring to FIG. 18, the second masking pattern M2 is formed to cover the pixel areas P1 and P3 except for the second pixel area P2. Thereafter, the intermediate layer 220, the second electrode 230, and the conductive protection layer 240' are sequentially formed on the substrate 100 on which the second masking pattern M2 is formed. The intermediate layer 220 may include the first intermediate layer 221, the emission layer 222G realizing a green color, and the second intermediate layer 223. The detailed configuration of the intermediate layer 220, the second electrode 230, and the conductive protection layer 240' may be the same as described above.

According to an embodiment, the thickness of the second masking pattern M2 may be greater than a sum of thicknesses of the intermediate layer 220, the second electrode 230, and the conductive protection layer 240'. Thus, the intermediate layer 220, the second electrode 230, and the conductive protection layer 240' on the second pixel area P2 may be discontinuously formed with the intermediate layer 220, the second electrode 230, and the conductive protection layer 240' formed on the second masking pattern M2.

Figure 19:
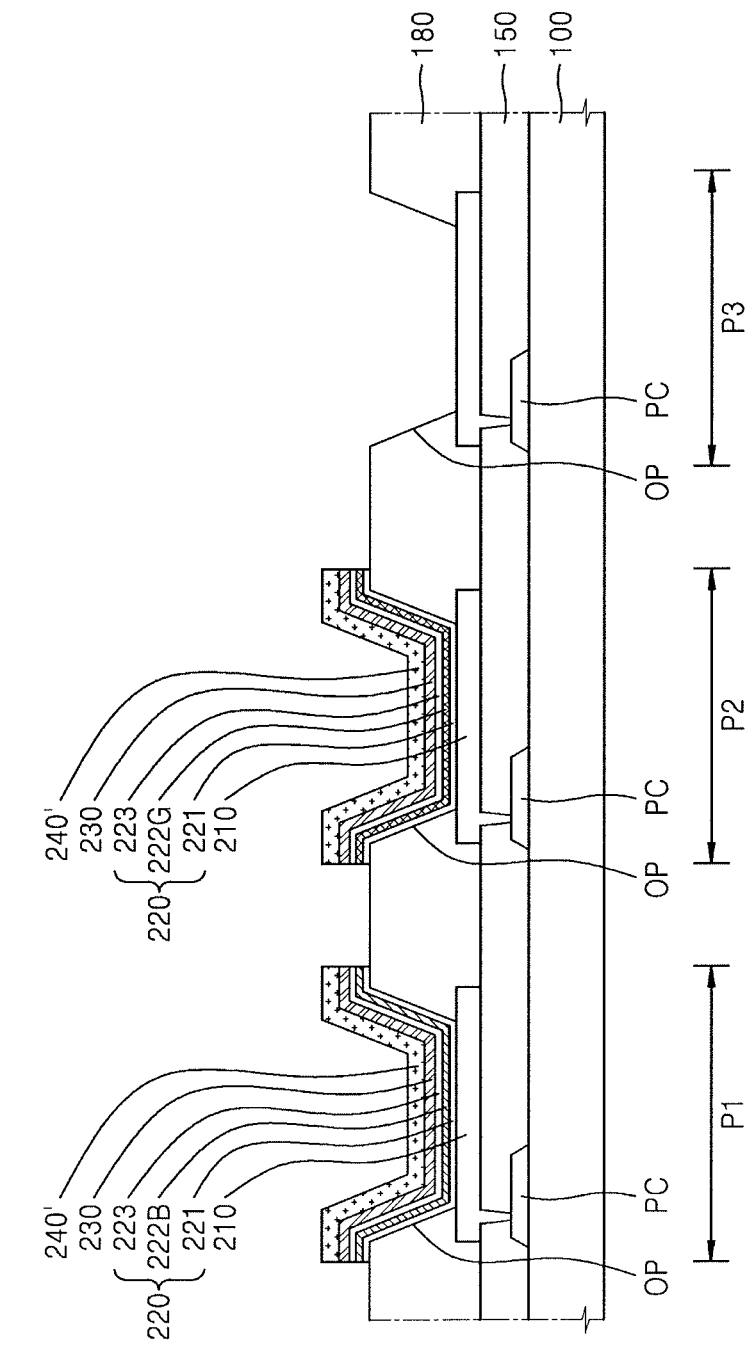

Referring to FIG. 19, the second masking pattern M2 is removed through the lift-off process. When the second masking pattern M2 is removed, the intermediate layer 220, the second electrode 230, and the conductive protection layer 240' that are patterned as an island type remain on the second pixel area P2.

Figure 20:
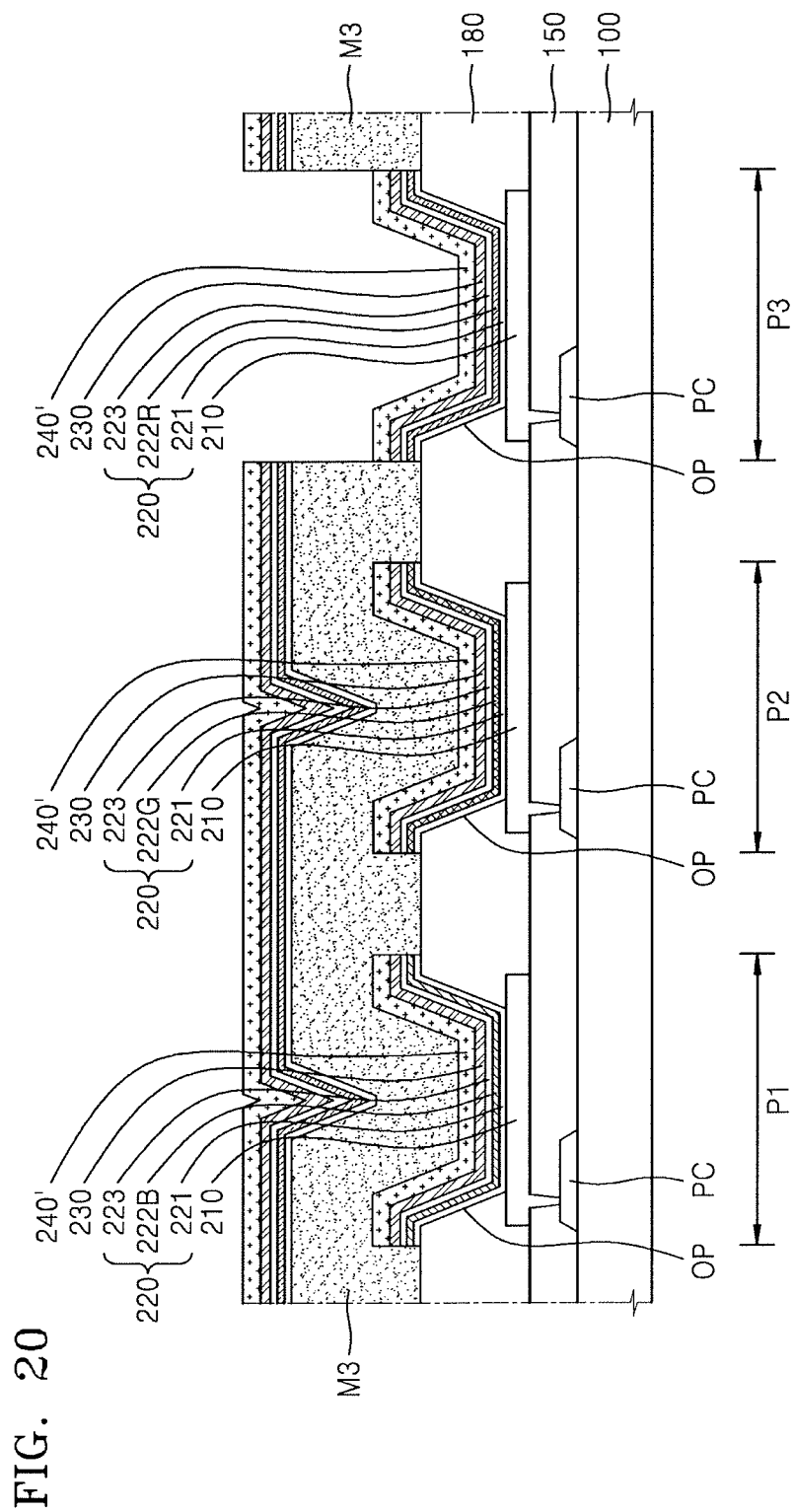

Referring to FIG. 20, the third masking pattern M3 is formed to cover the pixel areas P1 and P2 except for the third pixel area P3. Thereafter, the intermediate layer 220, the second electrode 230, and the conductive protection layer 240' are sequentially formed on the substrate 100 on which the third masking pattern M3 is formed. The intermediate layer 220 may include the first intermediate layer 221, the emission layer 222R realizing a red color, and the second intermediate layer 223. The detailed configuration of the intermediate layer 220, the second electrode 230, and the conductive protection layer 240' may be the same as described above.

According to an embodiment, the thickness of the third masking pattern M3 may be greater than a sum of thicknesses of the intermediate layer 220, the second electrode 230, and the conductive protection layer 240'. Thus, the intermediate layer 220, the second electrode 230, and the conductive protection layer 240' on the third pixel area P3 may be discontinuously formed with the intermediate layer 220, the second electrode 230, and the conductive protection layer 240' formed on the third masking pattern M3.

Figure 21:
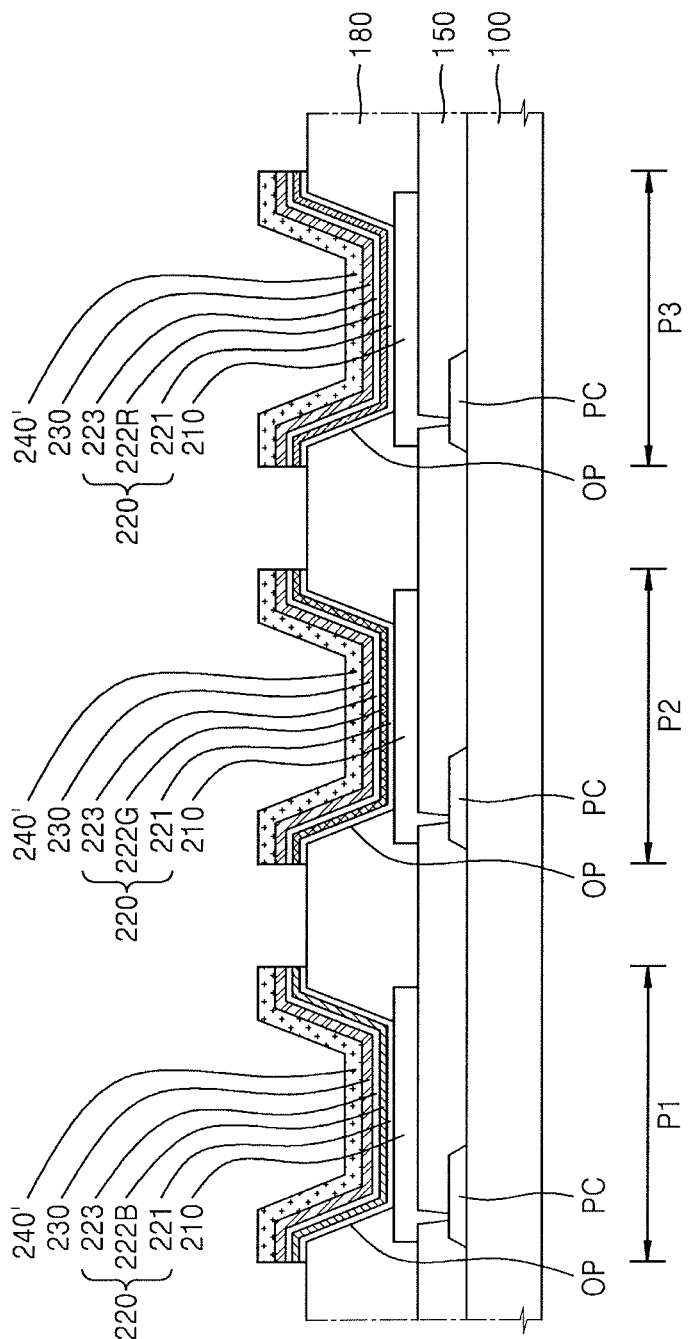
Figure 22:
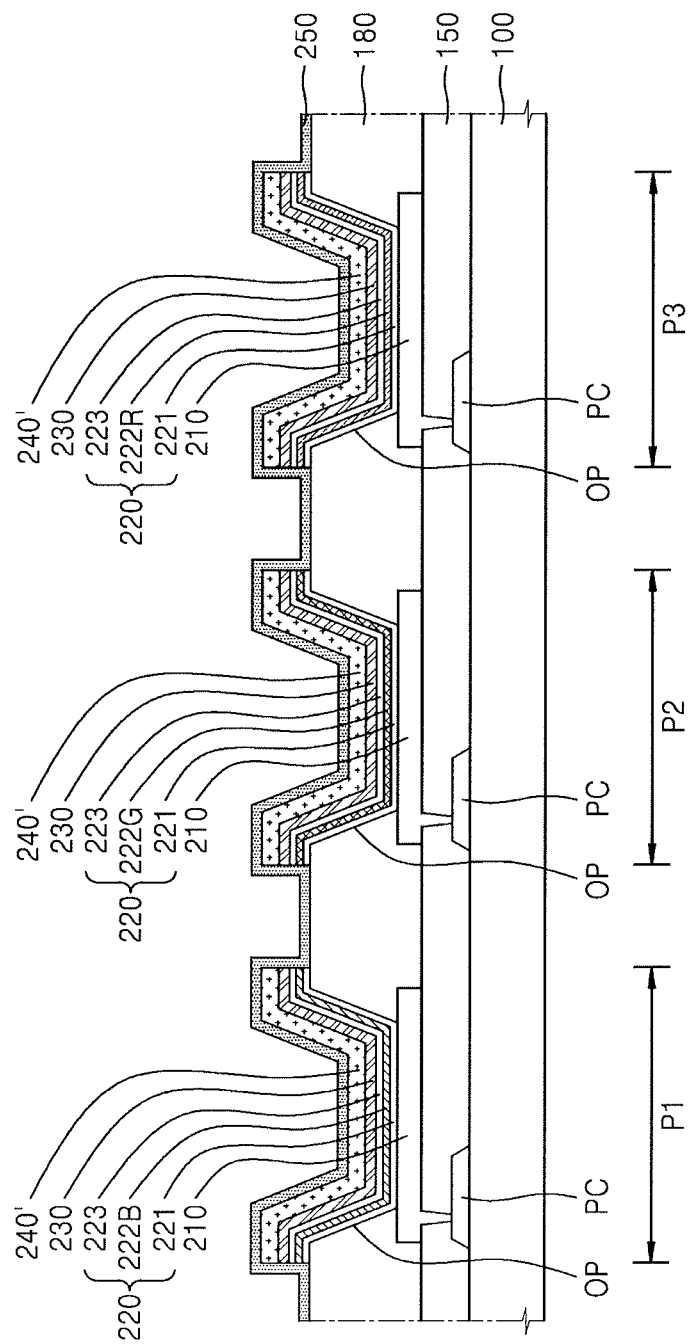

Referring to FIG. 21, the third masking pattern M3 is removed through the lift-off process. When the third masking pattern M3 is removed, the intermediate layer 220, the second electrode 230, and the conductive protection layer 240' that are patterned in the island type remain on the third pixel area P3.

According to the processes described with reference to FIGS. 16 to 21, the second electrode 230 is patterned while the conductive protection layer 240' is formed thereon, thereby effectively preventing deterioration of transmittance, since the second electrode 230 formed as a transflective metal layer is exposed to oxygen and is oxidized during a process of performing lift-off or other processes.

The organic light emitting display device according to the present embodiment may individually set various resonance distances in each of the pixel areas P1, P2, and P3 since the intermediate layer 220, the second electrode 230, and the conductive protection layer 240' are patterned in each of the pixel areas P1, P2, and P3. For example, each of the pixel areas P1, P2, and P3 may independently set thicknesses of the intermediate layer 220, the second electrode 230, and the conductive protection layer 240'. For example, each of the pixel areas P1, P2, and P3 may include at least one of a first optical resonance distance from the second electrode 230 to the connection electrode layer 250, a second optical resonance distance from the first electrode 210 to the second electrode 230, and a third optical resonance distance from the first electrode 210 to the connection electrode layer 250.

Figure 23:
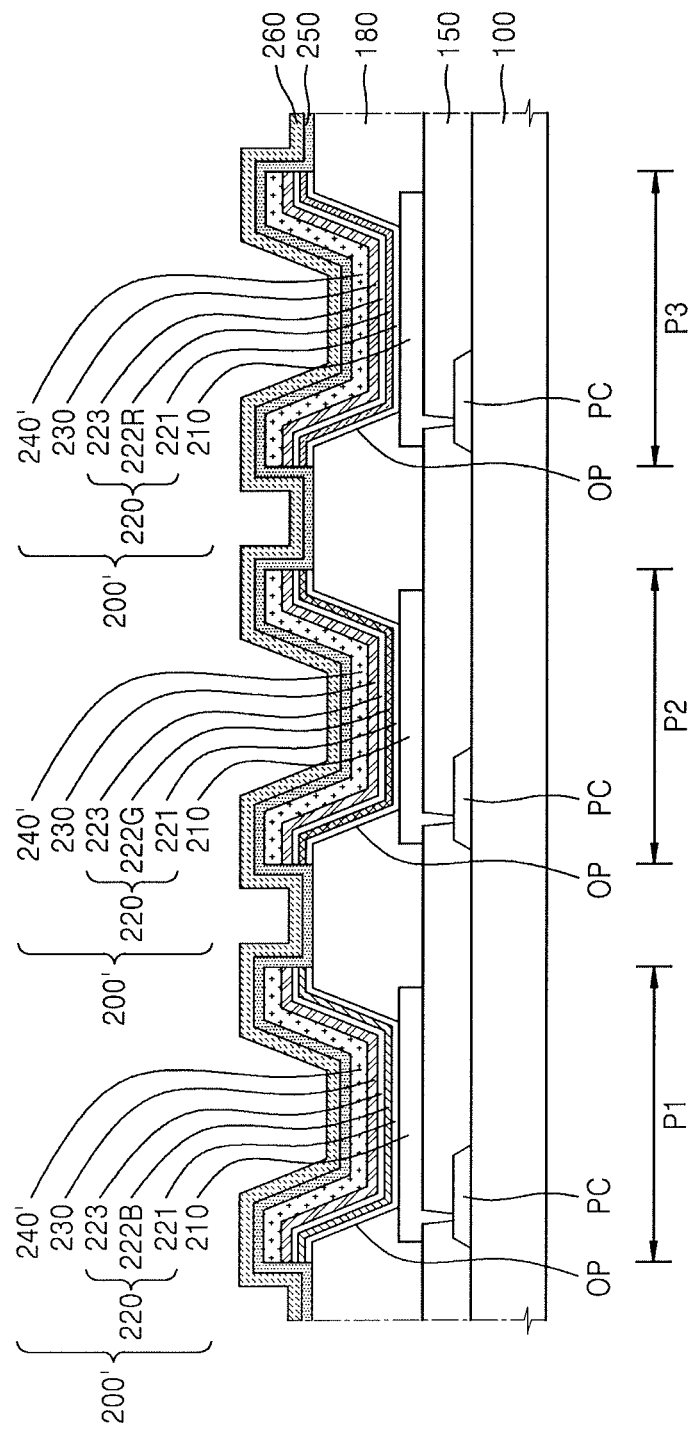
FIG. 23 illustrates another embodiment of an organic light emitting display.

FIG. 23 illustrates a cross-sectional view of another embodiment of an organic light emitting display device. Referring to FIG. 23, the organic light emitting display device may include the protection layer 260 formed on the connection electrode layer 250. When the connection electrode layer 250 formed as a transflective metal layer is exposed to oxygen during a manufacturing process of the organic light emitting display device, its translucency may deteriorate since the connection electrode layer 250 is oxidized. To prevent this, the organic light emitting display device may include the protection layer 260 that includes an organic material and/or an inorganic material having translucency.

As described above, according to the organic light emitting display device and the method of manufacturing the organic light emitting display device of the one or more of the above exemplary embodiments, light efficiency may be improved.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. An organic light emitting display device, comprising:
   a substrate including a plurality of pixel areas, the plurality of pixel areas includes a first pixel area and a second pixel area;
   a plurality of first electrodes corresponding to the pixel areas and separated from each other;
   a pixel defining layer including a plurality of openings corresponding to the pixel areas and overlapping the first electrodes;
   a plurality of intermediate layers corresponding to the pixel areas and separated from each other, wherein each intermediate layer includes a light emitting layer and a first sub-intermediate layer interposed between the first electrode and the light emitting layer, and a first thickness of the intermediate layer of the first pixel area is different from a second thickness of the intermediate layer of the second pixel area;
   a plurality of second electrodes corresponding to the pixel areas and separated from each other, each of the second electrodes extending along a bottom surface and sidewall of the opening in the pixel defining layer and overlapping an upper surface of the pixel defining layer;
   a conductive protection layer over the second electrodes; and
   a connection electrode layer over the conductive protection layer and electrically connecting the second electrodes.

2. The display device as claimed in claim 1, wherein the connection electrode layer is integrally formed to cover the pixel areas.

3. The display device as claimed in claim 1, wherein the second electrodes and the connection electrode layer include a transflective metal layer.

4. The display device as claimed in claim 1, wherein a thickness of the conductive protection layer is greater than a thickness of each of the second electrodes and a thickness of the connection electrode layer.

5. The display device as claimed in claim 1, wherein the conductive protection layer is a translucent layer.

6. The display device as claimed in claim 1, wherein the intermediate layers and the second electrodes corresponding to the pixel areas have substantially a same pattern.

7. The display device as claimed in claim 1, wherein at least one of a distance between the first electrode and the second electrode corresponding to at least one of the pixel areas or a distance between the first electrode and the connection electrode layer corresponding to at least one of the pixel areas corresponds to an optical resonance distance of light emitted from the at least one of the pixel areas.

8. The display device as claimed in claim 1, wherein:
a thickness of the second electrode corresponding to the first pixel area is different from a thickness of the second electrode corresponding to the second pixel area.

9. The display device as claimed in claim 1, wherein the conductive protection layer is integrally formed with respect to the second electrodes.

10. The display device as claimed in claim 9,
wherein at least part of a top surface of the pixel defining layer is in direct contact with the conductive protection layer.

11. The display device as claimed in claim 9, wherein the conductive protection layer has a thickness based on an optical resonance distance of light emitted from one of the pixel areas.

12. The display device as claimed in claim 1, wherein the conductive protection layer has island-type patterns corresponding to the pixel areas of the substrate.

13. The display device as claimed in claim 12, wherein each of the island-type patterns substantially corresponds to an island-type pattern of the second electrodes.

14. The display device as claimed in claim 12,
wherein at least part of a top surface of the pixel defining layer is in direct contact with the connection electrode layer.

15. The display device as claimed in claim 12, wherein:
a thickness of a first island-type pattern of the conductive protection layer corresponding to the first pixel area is different from a thickness of a second island-type pattern of the conductive protection layer corresponding to the second pixel area.

16. The display device as claimed in claim 1, wherein the first electrodes are anodes and the second electrodes are cathodes.

17. The display device as claimed in claim 1, further comprising:
a protection layer on the connection electrode layer.

18. The display device as claimed in claim 1, wherein the first sub-intermediate layer includes a hole transport layer.

19. The display device as claimed in claim 1, wherein a distance between the second electrode and the connection electrode layer corresponding to at least one of the pixel areas corresponds to an optical resonance distance of light emitted from the at least one of the pixel areas.

20. A method for manufacturing an organic light emitting display device, the method comprising:
preparing a substrate including a plurality of pixel areas, the plurality of pixel areas includes a first pixel area and a second pixel area;
patterning first electrodes which are separated from each other and which correspond to the pixel areas of the substrate;
forming a pixel defining layer including a plurality of openings corresponding to the pixel areas and overlapping the first electrodes;
forming intermediate layers and second electrodes, each of the intermediate layers and the second electrodes having island-type pattern to be separated from each other in correspondence to the plurality of pixel areas of the substrate, wherein each intermediate layer includes a light emitting layer and a first sub-intermediate layer such that the first sub-intermediate layer is interposed between the first electrode and the light emitting layer, and wherein a first thickness of the intermediate layer of the first pixel area is different from a second thickness of the intermediate layer of the second pixel area, and wherein each of the second electrodes extend along a bottom surface and sidewall of the opening in the pixel defining layer and overlap an upper surface of the pixel defining layer;
forming a conductive protection layer covering the second electrodes; and
forming a connection electrode layer on the conductive protection layer, integrally formed with the pixel areas, and electrically connecting the second electrodes.

21. The method as claimed in claim 20, wherein the second electrodes and the connection electrode layer include a transflective metal layer.

22. The method as claimed in claim 20, wherein a thickness of the conductive protection layer is greater than a thickness of each of the second electrodes and a thickness of the connection electrode layer.

23. The method as claimed in claim 20, wherein the conductive protection layer is a translucent layer.

24. The method as claimed in claim 20, wherein forming the intermediate layers and the second electrodes includes:
forming a masking pattern, on the substrate, with an opening exposing a first electrode corresponding to a first pixel area, the first pixel area corresponding to a first color emission of light;
forming an intermediate layer on an surface of the substrate including the masking pattern;
forming the second electrodes on the intermediate layer; and
removing the masking pattern such that the intermediate layers and the second electrodes in the island-type pattern remain in correspondence to the first pixel area.

25. The method as claimed in claim 20, wherein the conductive protection layer is integrally formed with respect to the second electrodes.

26. The method as claimed in claim 20, wherein the conductive protection layer has an island-type pattern substantially corresponding to the island-type pattern of each of the second electrodes.

27. The method as claimed in claim 20, wherein the first electrodes are anodes and the second electrodes are cathodes.

28. The method as claimed in claim 20, wherein the first sub-intermediate layer includes a hole transport layer.

29. The method as claimed in claim 20, further comprising:
forming a protection layer on the connection electrode layer.

30. The method as claimed in claim 20, wherein a distance between the second electrode and the connection electrode layer corresponding to at least one of the pixel areas corresponds to an optical resonance distance of light emitted from the at least one of the pixel areas.

31. An organic light emitting display device, comprising:
a substrate including a plurality of pixel areas, the plurality of pixel areas includes a first pixel area corresponding to first color emission of light and a second pixel area corresponding to a second color emission of light;
a plurality of first electrodes corresponding to the pixel areas and separated from each other;
a plurality of intermediate layers corresponding to the pixel areas and separated from each other;
a plurality of second electrodes corresponding to the pixel areas and separated from each other;

a conductive protection layer over the second electrodes, wherein a thickness of at least a part of the conductive protection layer is selected to provide an optical resonance distance of light in the first pixel area; and a connection electrode layer over the conductive protection layer and electrically connecting the second electrodes.

* * * * *